(12) United States Patent
Hasegawa et al.

(10) Patent No.: US 12,736,883 B2
(45) Date of Patent: Sep. 15, 2026

(54) SEPARATION AND RECOVERY DEVICE, SEPARATION AND RECOVERY METHOD, DEVELOPMENT SYSTEM, AND DEVELOPER RECYCLING METHOD

(71) Applicant: ASAHI KASEI KABUSHIKI KAISHA, Tokyo (JP)

(72) Inventors: Ryosuke Hasegawa, Tokyo (JP); Tomoya Yoshino, Tokyo (JP); Hideo Saito, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 494 days.

(21) Appl. No.: 18/275,525

(22) PCT Filed: Feb. 15, 2022

(86) PCT No.: PCT/JP2022/005891
§ 371 (c)(1),
(2) Date: Aug. 2, 2023

(87) PCT Pub. No.: WO2022/173054
PCT Pub. Date: Aug. 18, 2022

(65) Prior Publication Data

US 2023/0418163 A1 Dec. 28, 2023

(30) Foreign Application Priority Data

Feb. 15, 2021 (JP) ................................ 2021-021813

(51) Int. Cl.
*C02F 1/02* (2023.01)
*B01D 17/04* (2006.01)
(Continued)

(52) U.S. Cl.
CPC ......... *G03F 7/3092* (2013.01); *B01D 17/042* (2013.01); *B05B 17/06* (2013.01); *C02F 1/02* (2013.01); *C02F 1/66* (2013.01)

(58) Field of Classification Search
CPC ........... C02F 1/02; B05B 17/06; G03F 7/3092
See application file for complete search history.

(56) References Cited

U.S. PATENT DOCUMENTS 4,599,294 A * 7/1986 Matsumoto ........ G03G 9/09392 264/10
5,004,522 A * 4/1991 Koboshi ............. G03C 5/3952 203/1

(Continued)

FOREIGN PATENT DOCUMENTS

JP 2004-66118 A 3/2004
JP 2009-142727 A 7/2009

(Continued)

OTHER PUBLICATIONS

International Search Report and Written Opinion issued in International Patent Application No. PCT/JP2022/005891, dated May 17, 2022, along with an English translation thereof.

(Continued)

*Primary Examiner* — Jonathan Miller
(74) *Attorney, Agent, or Firm* — Greenblum & Bernstein, P.L.C.

(57) ABSTRACT

The purpose of the invention is to provide a separation and recovery device capable of separating and recovering a liquid having a high solvent concentration from a development waste liquid containing a development residue, with a high processing capacity without mixing the development residue in the recovered liquid. The device is a separation and recovery device for separating and recovering a solvent component from a development waste liquid containing a development residue and has a waste-liquid heating mecha- (Continued)

nism for heating the development waste liquid, an atomization chamber having an ultrasonic element for atomizing the development waste liquid heated by the waste-liquid heating mechanism into mists, and a mist recovery mechanism for recovering the mists formed in the atomization chamber.

34 Claims, 9 Drawing Sheets

(51) Int. Cl.

| | |
|---|---|
| ***B05B 17/06*** | (2006.01) |
| ***C02F 1/66*** | (2023.01) |
| ***G03F 7/30*** | (2006.01) |

(56) References Cited

U.S. PATENT DOCUMENTS 5,057,191 A * 10/1991 Kurematsu .......... B01D 1/0082 436/55
5,573,895 A * 11/1996 Komatsu .............. G03C 5/3958 202/205
5,770,019 A * 6/1998 Kurematsu ............ B01D 3/007 202/205
6,159,345 A * 12/2000 Donnelly ................. B01D 3/10 202/205
6,949,331 B2 * 9/2005 Ishikawa .............. G03C 5/3952 430/398
10,220,333 B2 * 3/2019 Matsuura ............... B01D 17/00
10,706,767 B2 7/2020 Fan et al.
2004/0182266 A1 9/2004 Asato et al.
2005/0069820 A1 * 3/2005 Nomura ............... G03C 5/3952 430/398
2007/0295595 A1 * 12/2007 Matsuura ............... B01D 17/04 210/188
2008/0192618 A1 8/2008 Nakata et al.
2013/0230808 A1 * 9/2013 Suzuki .................. G03F 7/3092 430/300
2014/0234778 A1 8/2014 Kobayashi et al.
2016/0018778 A1 1/2016 Matsuoka
2016/0184738 A1 * 6/2016 Matsuura ............... B01D 17/00 210/180
2023/0305419 A1 * 9/2023 Watanabe .............. G03G 9/081

FOREIGN PATENT DOCUMENTS

JP 2011-232407 A 11/2011
JP 2012-187580 A 10/2012
JP 2013-000613 A 1/2013
JP 2019-57637 A 4/2019
WO 03/005129 A1 1/2003
WO 2014/196358 A1 12/2014

OTHER PUBLICATIONS

International Preliminary Report on Patentability issued in International Patent Application No. PCT/JP2022/005891, dated Aug. 15, 2023, along with an English translation thereof.
Supplementary European Search Report that issued in European Application No. 22752876.7, dated Sep. 18, 2024.

* cited by examiner

CONDENSATION MECHANISM
73
RECOVERED LIQUID TANK
76
MIST RECOVERY MECHANISM
72
72A
7
ATOMIZATION CHAMBER
71
75
STORAGE CHAMBER
74

71
71C
71D
71D
θ
71E
71Ab
71A
DEVELOPMENT
WASTE LIQUID
71Aa
71B
(B)
71
71C
71E
71Ab
71A
DEVELOPMENT
WASTE LIQUID
71Aa
71B
(A)

(B)

(A)

(A)

(B)

(A)

(B)

SEPARATION AND RECOVERY DEVICE, SEPARATION AND RECOVERY METHOD, DEVELOPMENT SYSTEM, AND DEVELOPER RECYCLING METHOD

TECHNICAL FIELD

The present invention relates to a separation and recovery device for separating and recovering a solvent component from a development waste liquid containing a development residue, a separation and recovery method, a development system, and a developer recycling method.

BACKGROUND ART

A printing plate having a photosensitive resin can be made by computer platemaking technologies (which will hereinafter be called "CTP technologies") that directly draw data, obtained by processing on a computer, onto a printing plate and form a relief thereon. Of these, flexographic printing, a kind of letterpress printing uses a printing plate made of a soft material such as rubber or synthetic resin so that it has such an advantage that it can be applied to various substrates.

The printing plate (particularly, flexographic printing plate) by the CTP technologies is obtained by the following procedures, that is, laser drawing on an infrared absorption layer on a photosensitive resin, exposing the photosensitive resin layer to light to cure it, developing an uncured portion, drying the plate thus obtained, and post-exposing it to light. The flexographic printing plate can be obtained by carrying out organic solvent development in which an uncured portion is dissolved and developed with an organic solvent developer, water-based development in which an uncured portion is peeled and developed with a water-based developer containing a surfactant, or thermal development in which a printing original plate is heated and an uncured portion is wiped with a nonwoven cloth. When organic solvent development or water-based development is selected from them and conducted, a waste liquid of the solution appears.

In organic solvent development, the solution after development is recovered by distillation and reused. In water-based development, a method of reusing water recovered by distillation under reduced pressure is disclosed (refer to, for example, Patent Document 1). In the distillation method, however, latent heat of water is large and tremendous energy is required for distillation. At present, as a separation and recovery method of a water-based development waste liquid, disclosed is a method of adding a coagulant to a development waste liquid to cause solid-liquid separation and then passing the liquid through an activated carbon filter to separate it into a development residue and a developer (refer to, for example, Patent Document 2). This method however may adversely affect the developability when a recovered liquid is reused because the coagulant causes a change in pH of the recovered liquid. In addition, the coagulant aggregates only a portion of a resin component, which is a development residue, as a solid so that when a remaining development residue is removed using an activated carbon filter, the activity of the activated carbon does not last long and it should be exchanged or regenerated with high frequency.

In recent years, disclosed is a method of ultrasonically atomizing the development waste liquid to separate and recover a solvent component therefrom (refer to, for example, Patent Document 3). This method does not cause a pH change in the recovered liquid and does not use a filter or the like so that neither an exchange step or regeneration step is necessary.

CITATION LIST

Patent Documents

Patent Document 1: International Publication No. 2003/005129

Patent Document 2: International Publication No. 2014/196358

Patent Document 3: Japanese Patent Application Laid-Open No. 2013/000613

SUMMARY OF INVENTION

Technical Problem

It is however impossible to achieve a sufficient separation and recovery performance even if the method described in Patent Document 3 is used for a water-based development waste liquid. Described specifically, since an amount of a liquid which can be recovered per hour (which will hereinafter be called "processing capacity") by ultrasonic atomization is small, it takes time for separation and recovery. In addition, since the concentration of a solvent component in the developer contained in the recovered liquid is low, it is difficult to reuse it (the term "solvent component" as used herein means a component which is contained in the development waste liquid but is other than a development residue, and constitutes the developer). In addition to the aforesaid problems, there is also such a problem that the development residue to be separated is mixed in the recovered liquid.

The present invention has been made with these problems in consideration. The purpose is to provide a separation and recovery device (separation and recovery method) capable of, with a high processing capacity, separating a development waste liquid containing a development residue and recovering a liquid having a high solvent concentration without mixing the development residue therein.

Solution to Problem

In order to achieve the aforesaid purpose, a first separation and recovery device according to the present invention is for separating and recovering a solvent component from a development waste liquid generated during the development of a flexographic-printing original plate and it is equipped with a waste-liquid heating mechanism for heating the development waste liquid, an atomization chamber having an ultrasonic element for atomizing the development waste liquid heated by the waste-liquid heating mechanism into mists, and a mist recovery mechanism for recovering the mists formed in the atomization chamber. It is to be noted that when as the development waste liquid, a water-based development waste liquid generated by developing a flexographic-printing original plate with a water-based developer containing at least a surfactant is used, the waste-liquid heating mechanism can heat the water-based development waste liquid at a temperature causing layer separation of the water-based development waste liquid in a static state into two layers.

When such a constitution is used, it is possible to atomize the development waste liquid into mists by using the ultrasonic element, recover the thus-formed mists by the mist recovery mechanism, and thereby remove a development residue from the development waste liquid and recover a solvent. The present device heats the development waste liquid by means of the waste-liquid heating mechanism prior to atomization and therefore can produce, with a high processing capacity, a recovered liquid having a high solvent concentration.

A second separation and recovery device according to the present invention is for separating and recovering a solvent component from a water-based development waste liquid generated by developing a flexographic-printing original plate with a water-based developer containing at least a surfactant and it is equipped with a waste-liquid heating mechanism for heating the water-based development waste liquid at a temperature causing layer separation of the water-based development waste liquid in a static state into two layers. In addition, the second separation and recovery device according to the present invention, similar to the first separation and recovery device, may be equipped further with an atomization chamber having an ultrasonic element for atomizing the development waste liquid heated by the waste-liquid heating mechanism into mists and a mist recovery mechanism for recovering the mists formed in the atomization chamber.

When such a constitution is used, it is possible to heat the water-based development waste liquid, which is generated by carrying out development with the water-based developer containing at least a surfactant, at a certain temperature (a temperature which causes layer separation of the water-based development waste liquid in a static state) and thereby separate the water-based development waste liquid in a static state into a waste liquid layer (layer containing a development residue) and a developer layer (layer which is composed mainly of water as a solvent and is not the waste liquid layer). Then, the developer layer is recovered (by atomizing the developer layer into mists and recovering the thus-formed mists by the mist recovery mechanism), by which the water-based developer is recovered efficiently.

The (first or second) separation and recovery device according to the present invention may further have the following constituent as needed.

(1) The atomization chamber has a reservoir space for storing the development waste liquid, an ultrasonic element provided in the reservoir space, and a mist recovery port provided vertically above the reservoir space for supplying the mist recovery mechanism with the mists formed in the reservoir space. The reservoir space is a substantially tube-shaped space surrounded by a bottom wall and side walls connected to the periphery of the bottom wall. To the upper end of the side walls, connected are inclined walls, which incline to the planar-view center of the reservoir space as they move vertically upward. The mist recovery port is contoured by the upper end of these inclined walls.

(2) The atomization chamber has a mist sorting mechanism for sorting the mists formed in the atomization chamber into a mist to be recovered by the mist recovery mechanism and a mist to be recondensed and returned into the development waste liquid according to the size and/or mass of the mists. The mist sorting mechanism has at least one layer or more of punching boards provided between the liquid surface of the development waste liquid and the mist recovery port in the atomization chamber. The hole of the punching board has a diameter of 2 mm or more and 8 mm or less.

(3) The separation and recovery device has an air heating mechanism for heating the air to be supplied into the atomization chamber.

(4) The separation and recovery device has a condensation mechanism for condensing the mists recovered by the mist recovery mechanism.

(5) The separation and recovery device has a storage chamber for storing the development waste liquid supplied from the outside, a pump and a pipe for supplying the development waste liquid from the storage chamber to the atomization chamber, and a pipe for sending an overflowing portion of the development waste liquid which has been supplied into the atomization chamber and has remained after the atomization processing (such a mechanism will hereinafter be called "waste-liquid circulation mechanism").

(6) The atomization chamber has a structure in which an upper space for storing the development waste liquid therein and a lower space having the ultrasonic element placed therein are separated from each other and a cooling fluid for cooling the ultrasonic element is stored in the lower space.

Such constitutions offer the following advantages. First, (1) since the inclined walls which incline toward the planar-view center of the reservoir space as they move vertically upward are connected to the upper end of the side walls forming the reservoir space of the atomization chamber and the mist recovery port is contoured by the upper end of these inclined walls, the retention and recondensation of the mists at the upper corner of the atomization chamber can be suppressed and the mists formed in the atomization chamber can be recovered efficiently. Next, (2) since the atomization chamber has the mist sorting mechanism, mixing of the development residue in the recovered liquid can be suppressed. In addition, using the inclined walls and an appropriate mist sorting mechanism makes it possible to control the flow of the mists in the atomization chamber and markedly improve the mist recovery efficiency while suppressing mixing of the development residue in the recovered liquid. Next, (3) since the device has the air heating mechanism, the mists formed in the atomization chamber can be recovered efficiently. Next, (4) since the device has the condensation mechanism, the mists recovered can be condensed efficiently. Next, (5) since the device has the waste-liquid circulation mechanism and uses a batch processing method, the waste liquid can be efficiently heated. Next, (6) since the upper space for storing the developing waste liquid therein is separated from the lower space having the ultrasonic element therein to enable cooling of the lower space, a production amount of the mists can be increased while suppressing deterioration of the ultrasonic element. Thus, such constitutions make it possible to separate and recover with a high processing capacity, from the development waste liquid, a recovered liquid having a high solvent concentration without mixing the development residue therein.

The development system of the present invention is a system of developing a flexographic-printing original plate having, on the surface thereof, a photosensitive resin layer and it has a carrier unit for carrying an original plate having an exposed portion and an unexposed portion formed in the photosensitive resin layer, a developer supply unit for supplying a developer to the original plate carried by the carrier unit and placed in a development region, an unexposed-portion removal unit for scrubbing the surface of the original plate placed in the development region to remove the unexposed portion, a rinse liquid supply unit for supplying a rinse liquid to the original plate carried by the carrier unit and placed in a rinse region adjacent to the development region and thereby washing the surface of the original plate with the liquid, and the (first or second) separation and recovery device of the present invention. The solvent recovered by the separation and recovery device is reused as a portion of the developer to be supplied from the developer supply unit and/or a portion of the rinse liquid to be supplied from the rinse liquid supply unit.

Such a constitution makes it possible to reduce the amount of the development waste liquid and the using amount of a novel developer.

A first separation and recovery method of the present invention is a method of separating and recovering a solvent from a development waste liquid generated during the development of a flexographic-printing original plate and it includes a heating step for heating the development waste liquid to 35° C. or more and 90° C. or less, an atomization step for atomizing the development waste liquid heated in the heating step into mists, and a recovery step for recovering the mists generated by the atomization step. In the atomization step, the development waste liquid may be atomized into mists while continuing the heating step to heat the waste liquid.

When such a method is used, a solvent obtained by removing a development residue from the development waste liquid can be recovered by atomizing the development waste liquid into mists by means of an ultrasonic element and recovering the mists thus formed. In the present method, the development waste liquid is heated with the waste-liquid heating mechanism prior to the atomization so that a recovered liquid having a high solvent concentration can be obtained with high processing capacity.

A second separation and recovery method of the present invention is a method of separating and recovering a solvent from a water-based development waste liquid which is generated by developing a flexographic-printing original plate with a water-based developer containing at least a surfactant and it includes a heating step for heating the water-based development waste liquid at a temperature causing layer separation of the water-based development waste liquid in a static state into two layers, an atomization step for atomizing the development waste liquid heated in the heating step into mists, and a recovery step for recovering the mists formed in the atomization step. In the atomization step, the development waste liquid may be atomized into mists while continuing the heating step to heat the waste liquid.

When such a method is used, the water-based development waste liquid generated by carrying out development with the water-based developer containing at least a surfactant is heated at a certain temperature (temperature that causes separation of the water-based development waste liquid in a static state into two layers) and thereby, the water-based developer containing a very small amount of a development residue can be recovered efficiently.

A second separation and recovery method of the present invention may further include, prior to the heating step, an adjustment step for obtaining an adjusted water-based development waste liquid by carrying out at least one adjustment selected from the group consisting of the following (A) to (D):

(A) increasing the pH of the water-based development waste liquid;

(B) adding, to the water-based development waste liquid, a compound represented by the following formula (1), a compound represented by the following formula (2), or a combination of them:

Formula (1): $R^1O(A^1O)_nR^2$ (wherein, $R^1$ and $R^2$ each independently represent an alkyl group having 2 to 6 carbon atoms or an alkenyl group having 2 to 6 carbon atoms, $A^1$ represents an alkylene group having 2 to 4 carbon atoms, and n is an integer of 1 to 5)

Formula (2): $R^3O(A^2O)_mH$ (wherein, $R^3$ represents an alkyl group having 3 to 8 carbon atoms or an alkenyl group having 3 to 8 carbon atoms, $A^2$ represents an alkylene group having 2 to 4 carbon atoms, and m is an integer of 1 to 5)

(C) removing a portion of a development residue from the water-based development waste liquid; and (D) removing a portion of the surfactant from the water-based development waste liquid.

In the second separation and recovery method of the present invention, a surfactant represented by the following formula (3):

Formula (3): $RO(AO)_pH$ (wherein, R represents an alkyl group or aryl group having 10 to 20 carbon atoms, A represents an alkylene group having 2 to 4 carbon atoms, and p is an integer of 1 to 50) may be used. In the above formula, R may represent an alkyl group or aryl group having 10 to 18 carbon atoms, A may represent an alkylene group having 2 to 4 carbon atoms, and p may be an integer of 6 to 10. The surfactant may have a cloud point of 40° C. or less. Further, the water-based development waste liquid may contain an inorganic base. As the water-based development waste liquid, a waste liquid which causes layer separation at 90° C. or less in a static state may be used.

A third separation and recovery method according to the present invention is a method of separating and recovering a solvent from a water-based development waste liquid generated by carrying out the development of a flexographic-printing original plate and it includes a heating step for heating the water-based development waste liquid at a temperature predicted to separate the water-based development waste liquid in a static state into two layers, an atomization step for atomizing the development waste liquid heated in the heating step into mists, and a recovery step for recovering the mists formed in the atomization step. The water-based development waste liquid contains a surfactant having a cloud point of 40° C. or less, a development residue, and water, and the predicted temperature is a temperature predicted based on the concentration of the development residue in the water-based development waste liquid, the concentration of the surfactant in the water-based development waste liquid, and the pH of the water-based development waste liquid. Preferably, the water-based development waste liquid contains an inorganic base. In the atomization step, the mists may be formed by atomizing the development waste liquid while continuing the heating step to heat the waste liquid.

When such a method is used, a water-based development waste liquid generated by carrying out development with a water-based developer containing at least a surfactant is heated at a certain temperature (temperature which is predicted to cause layer separation of the water-based development waste liquid in a static state) so that a water-based developer containing a very small amount of the development residue can be recovered efficiently.

As the temperature predicted in the third separation and recovery method of the present invention, a temperature satisfying the following formulas (4) and (5): [Math.1]

$$\frac{1}{1+\exp(-z)} \geq 0.5 \quad \text{Formula (4)}$$

[Math. 2]

$$z = -0.60713385 \times \frac{W - 2.03591046}{1.56737401407577} - 1.27547875 \times \frac{Ca - 2.45178061}{1.26267792013641} + 0.93568397 \times \frac{\text{pH} - 10.09333333}{0.301256627} + 3.17537577 \times \frac{T - 51.25}{7.96476616} + 3.30903047 \quad \text{Formula (5)}$$

(wherein, W is the concentration (mass %) of the development residue in the water-based development waste liquid, Ca is the concentration (mass %) of the surfactant in the water-based development waste liquid, pH is the pH of the water-based development waste liquid, and T is the temperature (° C.) of the water-based development waste liquid). In addition, a development waste liquid having a composition whose predicted temperature is 90° C. or less may be used as a processing object.

A fourth separation and recovery method according to the present invention is a method of separating and recovering a solvent from a water-based development waste liquid generated by developing a flexographic-printing original plate and it includes a heating step for heating the water-based development waste liquid at a temperature which is predicted to cause separation of the water-based development waste liquid in a static state into two layers, an atomization step for atomizing the development waste liquid heated in the heating step into mists, and a recovery step for recovering the mists formed in the atomization step. The water-based development waste liquid contains a surfactant having a cloud point of 40° C. or less, a development residue, water, and a compound represented by the following formula (1) and/or a compound represented by the following formula (2):

- Formula (1): $R^1O(A^1O)_nR^2$ (wherein, $R^1$ and $R^2$ each independently represent an alkyl group having 2 to 6 carbon atoms or an alkenyl group having 2 to 6 carbon atoms, $A^1$ represents an alkylene group having 2 to 4 carbon atoms, and n is an integer of 1 to 5)
- Formula (2): $R^3O(A^2O)_mH$ (wherein, $R^3$ represents an alkyl group having 3 to 8 carbon atoms or an alkenyl group having 3 to 8 carbon atoms, $A^2$ represents an alkylene group having 2 to 4 carbon atoms, and m is an integer of 1 to 5).
- The predicted temperature is a temperature predicted based on the concentration of the development residue in the water-based development waste liquid, the concentration of the surfactant in the water-based development waste liquid, the pH of the water-based development waste liquid, and the total concentration of the compounds represented by the formulas (1) and (2) in the water-based development waste liquid. Preferably, the water-based development waste liquid further contains an inorganic base. In the atomization step, the mists may be formed by atomizing the development waste liquid while continuing the heating step to heat the waste liquid.

When such a method is used, a water-based development waste liquid generated by carrying out development with a water-based developer containing at least a surfactant is heated at a certain temperature (temperature which is predicted to cause layer separation of the water-based development waste liquid in a static state) so that a water-based developer containing a very small amount of the development residue can be recovered efficiently.

As the temperature predicted in the fourth separation and recovery method of the present invention, usable is a temperature satisfying the following formulas (6) and (7):

[Math. 3]

$$\frac{1}{1+\exp(-z)} \geq 0.5 \quad \text{Formula (6)}$$

[Math. 4]

$$z = -0.60713385 \times \frac{W - 2.03591046}{1.56737401407577} - 1.27547875 \times \frac{Ca - 2.45178061}{1.26267792013641} + 0.93568397 \times \frac{\text{pH} - 10.09333333}{0.301256627} + 1.45202002 \times \frac{Cb - 0.71332546}{0.303775970083218} + 3.17537577 \times \frac{T - 51.25}{7.96476616} + 3.30903047 \quad \text{Formula (7)}$$

(wherein, W is the concentration (mass %) of the development residue in the water-based development waste liquid, Ca is the concentration (mass %) of the surfactant in the water-based development waste liquid, pH is the pH of the water-based development waste liquid, Cb is the total concentration (mass %) of the compounds represented by the formulas (1) and (2) in the water-based development waste liquid, and T is the temperature (° C.) of the water-based development waste liquid). In addition, a development waste liquid having a composition whose predicted temperature is 90° C. or less may be used as a processing object.

Another separation and recovery method according to the present invention is a method of separating and recovering a solvent from a water-based development waste liquid generated by developing a flexographic-printing original plate and it includes a heating-temperature determination step for determining the heating temperature of the development waste liquid, a heating step for heating the development waste liquid at the temperature determined in the heating-temperature determination step, an atomization step for atomizing the development waste liquid heated in the heating step into mists, and a recovery step for recovering the mists formed in the atomization step. The development waste liquid can be separated into two layers different in dispersion concentration of a development residue by heating. The temperature determined in the heating-temperature determination step is calculated from a temperature causing separation of the development waste liquid and it satisfies the following formulas (4) and (5):

[Math. 5]

$$\frac{1}{1+\exp(-z)} \geq 0.5 \quad \text{Formula (4)}$$

[Math. 6]

$$z = -0.60713385 \times \frac{W - 2.03591046}{1.56737401407577} - 1.27547875 \times \frac{Ca - 2.45178061}{1.26267792013641} + \quad \text{Formula (5)}$$

-continued $$0.93568397\times\frac{pH-10.09333333}{0.301256627}+3.17537577\times\frac{T-51.25}{7.96476616}+3.30903047$$

(wherein, W is the concentration (mass %) of the development residue in the water-based development waste liquid, Ca is the concentration (mass %) of the surfactant in the water-based development waste liquid, pH is the pH of the water-based development waste liquid, and T is the temperature (° C.) of the water-based development waste liquid).

The (first to fourth) separation and recovery methods according to the present invention may include a mist sorting step for sorting mists formed in the atomization step into a mist to be recovered and a mist to be recondensed and then returned in the development waste liquid, according to the size and/mass of the mists. By this mist sorting step, at least a portion of the development residue in the development waste liquid can be separated from the development waste liquid, making it possible to recover a solvent while reducing the mixing amount of the development residue.

The (first to fourth) separation and recovery methods according to the present invention may further include a step of returning an overflowing portion of the development waste liquid, which development waste liquid has remained after sent to an atomization chamber from a storage chamber for storing the development waste liquid supplied from the outside and subjected to atomization processing, to the storage chamber and then sending it to the atomization chamber again. This means that the development waste liquid containing the development residue is subjected to mist processing while being circulated between the atomization chamber and the storage chamber and thus, a solvent component is recovered and the development waste liquid is gradually concentrated (such a system will hereinafter be called "batch processing system").

The atomization chamber to be used in the atomization step of the (first to fourth) separation and recovery methods according to the present invention may have an upper space for storing the development waste liquid therein and a lower space having ultrasonic elements placed therein. In the atomization step, it is possible to set the temperature of a fluid flowing in the lower space to 10° C. or more and 40° C. or less and at the same time, set a temperature difference between the upper space and the lower space to 5° C. or more and 70° C. or less.

A developer recycling method according to the present invention is a method of supplying a solvent recovered by the (first to fourth) separation and recovery methods of the present invention to a development device equipped with a carrier unit for carrying a flexographic-printing original plate having an exposed portion and an unexposed portion formed in a photosensitive resin layer, a developer supply unit for supplying a developer to the original plate carried by the carrier unit and placed in a development region, an unexposed-portion removal unit for scrubbing the surface of the original plate placed in the development region to remove the unexposed portion, and a rinse liquid supply unit for supplying a rinse liquid to the original plate carried by the carrier unit and placed in a rinse region adjacent to the development region and thereby washing the surface of the original plate with it; and reusing the resulting solvent as a portion of the developer to be supplied from the developer supply unit and/or a portion of the rinse liquid to be supplied from the rinse liquid supply unit.

Using such a method makes it possible to reduce the amount of the development waste liquid and the using amount of a new developer.

A method of producing a water-based developer according to the present invention is to produce a new developer and/or rinse liquid with the solvent recovered by the (first to fourth) separation and recovery method of the present invention.

A method of producing a printing plate according to the present invention includes a step of irradiating a printing original plate with infrared rays to form a pattern, a step of irradiating the printing original plate having the pattern formed thereon with ultraviolet rays to expose the pattern, and a step of removing the unexposed portion in the exposing step with the water-based developer produced by the method of producing a water-based developer according to the present invention.

Advantageous Effects of Invention

The present invention makes it possible to provide a separation and recovery device (separation and recovery method) capable of separating and recovering, with a high processing capacity, a liquid having a high solvent concentration as a recovered liquid from a development waste liquid, without mixing a development residue therein.

DESCRIPTION OF EMBODIMENTS

Figure 1:
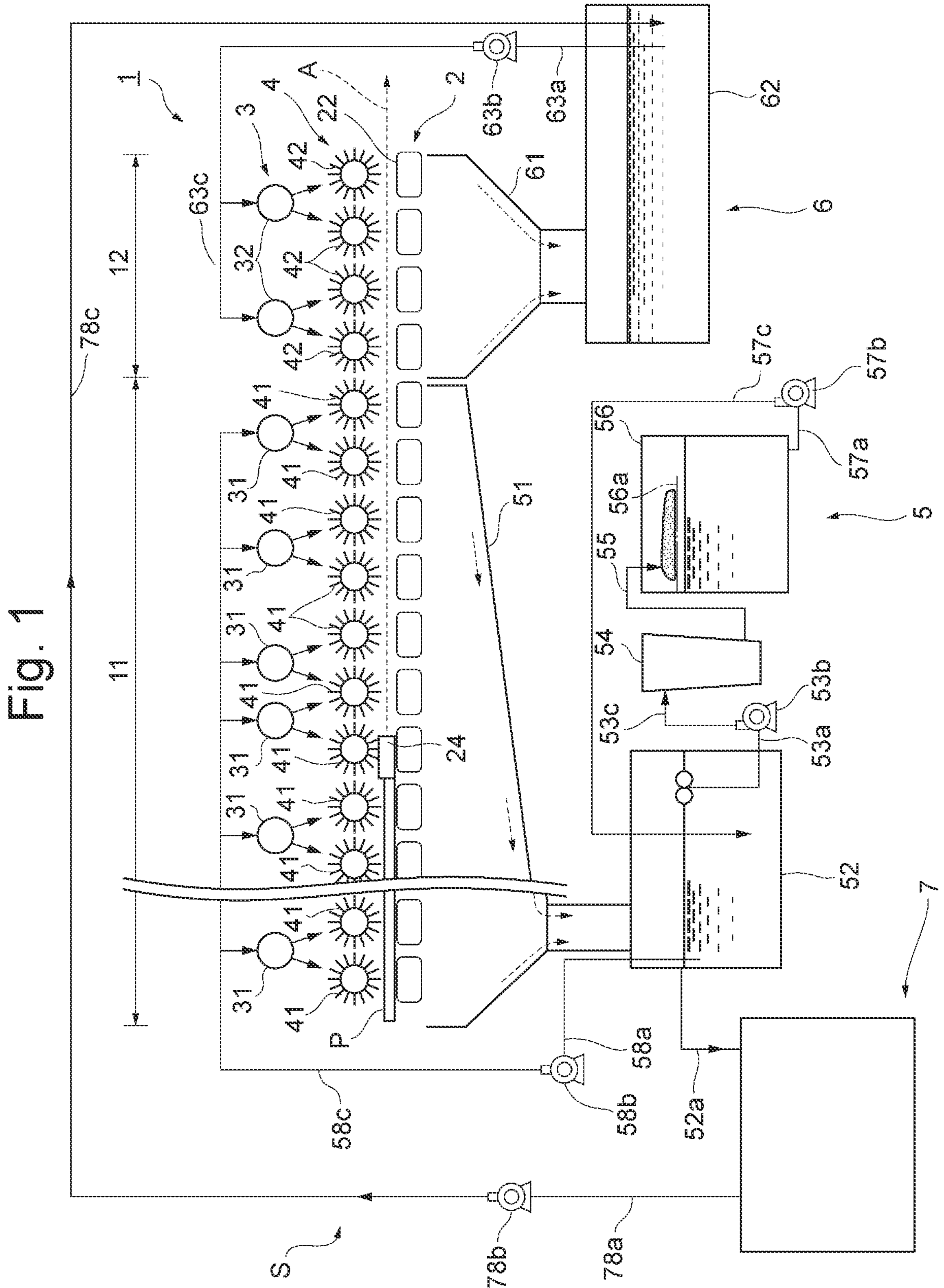
FIG. 1 is a block diagram for describing the constitution of a development system according to the embodiment of the present invention.

The embodiment of the present invention will hereinafter be described referring to some drawings. It is to be noted that the following embodiment is just a preferred application example and the application range of the present invention is not limited by it.

Definition

First, the definition of terms used herein will be described.

The term "development waste liquid" as used herein means a liquid generated in a development step using a developer and containing a developer and a development residue.

The term "water-based development waste liquid" as used herein means a development waste liquid containing water as a solvent.

The term "development residue" as used herein means an impurity (for example, a resin of an unexposed portion removed from a developed original plate) which mixes in a developer when a development step is performed.

The term "layer separation (separation into two layers)" as used herein means that a water-based development waste liquid separates into two layers, that is, a waste liquid layer and a developer layer. The layer separation usually occurs due to the separation of a surfactant from water under high-temperature conditions.

The term "layer-separation temperature" as used herein means a temperature causing layer separation of a water-based development waste liquid (or adjusted waste liquid obtained by an adjustment step) in a static state (which temperature sometimes corresponds to "a predicted temperature" which will be described later).

The term "minimum layer-separation temperature" as used herein means the lowest temperature causing layer separation of a water-based development waste liquid (or adjusted waste liquid obtained by an adjustment step) in a static state (which minimum temperature sometimes corresponds to "a minimum predicted temperature" which will be described later).

The term "waste liquid layer" as used herein means a development residue-containing layer. When the development residue is contained in any of the layers produced by layer separation, a layer having a higher development residue concentration is a waste liquid layer. The waste liquid layer usually contains a surfactant which no longer forms a micelle and it is observed as an opaque layer.

The term "developer layer" as used herein means a layer which is generated by layer separation but is not a waste liquid layer. The developer layer contains a developer.

The term "cloud point" of a surfactant as used herein means a temperature at which an aqueous solution containing 1 mass % of a surfactant starts clouding when macroscopically observed.

The term "predicted temperature" as used herein means a temperature which is predicted to cause layer separation of a water-based development waste liquid (or adjusted waste liquid obtained by an adjustment step) in a static state.

The term "minimum predicted temperature" as used herein means a minimum temperature which is predicted to cause layer separation of a water-based development waste liquid (or adjusted waste liquid obtained by an adjustment step) in a static state.

First, the constitution of a development system S according to the embodiment of the present invention will be described referring to FIG. 1.

The development system S of the present embodiment is a system for developing an original plate P having a photosensitive resin layer on the surface thereof and it includes a development device 1 and a separation and recovery device 7 which will be described in detail later. Each constitution of the development system S will next be described.

<Original Plate>

The original plate P to be processed by the development system S of the present embodiment is formed by stacking a photosensitive resin layer or infrared sensitive layer on the surface of a support not shown (for example, a film such as polyethylene terephthalate (PET)) and it is, as a whole, in the form of a sheet. The original plate P is formed through base formation by UV irradiation from the back side, laser drawing, UV irradiation from the surface to cure a drawn portion, and the like. As the photosensitive resin, usable are those containing a thermoplastic block copolymer, an elastomer selected from at least one of polybutadiene, polyacrylonitrile-butadiene, a polyurethane-based elastomer, and the like, a polyamide, a hydrophilic copolymer such as latex, a polymer selected from polyvinyl alcohols and the like, a carboxylic acid ester such as acrylic acid ester, methacrylic acid ester, fumaric acid ester, maleic acid ester, and the like, a derivative of acrylamide or methacrylamide, an allyl ester, styrene and a derivative thereof, a polymerizable unsaturated monomer selected from N-substituted maleimide compounds and the like, a photopolymerization initiator, and a stabilizer such as antioxidant. A portion of the surface of the original plate P is irradiated with ultraviolet rays prior to development processing with the development device 1. At a site irradiated with ultraviolet rays (that is, exposed site), a chemical change to cause curing of the photosensitive resin occurs. On the other hand, the photosensitive resin at an unexposed site is not cured. By the development processing of the development device 1, an uncured photosensitive resin is removed and the original plate P has, on the surface thereof, unevenness of a predetermined pattern.

<Development Device>

The development device 1 has, for example, a carrier unit 2, a discharge unit 3, and a brush unit 4 as shown in FIG. 1.

The carrier unit 2 is configured to carry the original plate P and it has, on the upper surface thereof, an original-plate placing unit 22. On the original-plate placing unit 22, the original plate P is placed with a surface subjected to exposure processing upward. The original plate P has a guide plate 24 fixed at one end portion thereof. The guide plate 24 is a member made of a metal and has a flat shape. The carrier unit 2 has a guide chain which is not shown. The guide chain is placed along the original-plate placing unit 22 and the guide plate 24 is locked, at the end thereof, to this guide chain. When a motor which is not shown is driven, the guide chain rotates and moves the guide plate 24 along the original-plate placing unit 22. By this movement, the original plate P is carried to the direction shown by an arrow A. Instead of fixing the original plate P with the guide plate 24, it is possible to use a method of fixing it onto a plate setter capable of fixing the lower surface of the original plate P with an adhesive sheet or the like and then carrying with the chain.

The discharge unit 3 is configured to discharge a developer or water and has a plurality of discharge pipes 31 and 32. The discharge pipes 31 and 32 are each placed above the original-plate placing unit 22 and have a tubular form. The discharge pipe 31 supplies, in a development region 11, a developer containing a used developer to the original plate P carried by the carrier unit 2 and it functions as a developer supply unit in the present invention. The discharge pipe 32 supplies, in a rinse region 12 adjacent to the downstream side of the development region, a rinse liquid to the original plate P carried by the carrier unit 2 and thereby removes an infrared receptive layer or photosensitive resin layer which is removed (not cured in the exposure step) in the development step and remains on the surface of the original plate P. Thus, it functions as a rinse liquid supply unit in the present invention.

The brush unit 4 has brushes 41 and 42. As the kind of the brushes 41 and 42, for example, a roll brush or flat brush can be used. When the brushes 41 and 42 are each a roll brush, they are placed above the original-plate placing unit 22 and below the discharge pipes 31 and 32 in such a manner that their shaft extends substantially horizontally. The brushes 41 and 42 have, at the periphery thereof, an elastic hair bundle. When the brushes 41 and 42 turn with their shaft as a center, the tip of the hair bundle moves around the shaft and placed on the side of the original-plate placing unit 22 in repetition. The brush 41 is placed in a development region 11 which will be described later and removes an unexposed portion by rubbing the surface of the original plate P. Thus, it functions as an unexposed-portion removal unit in the present invention. The brush 42 is placed in a rinse region 12 which will be described later and rubs the surface of the original plate P to remove the infrared receptive layer or photosensitive resin layer (not cured in the exposure step) which has been washed away in the development region. Similarly, when a flat brush is used for the brush unit for development, the flat brush can wash and remove the infrared receptive layer or photosensitive rein layer not cured in the exposure step by moving the flat brush by a motor connected to a rotating and/or revolving gear on the plate and rotating and/or revolving the flat brush on the plate.

The development device 1 can be divided into the development region 11 and the rinse region 12 as shown in FIG. 1. The development region 11 and the rinse region 12 are placed so that they are arranged in order of mention in a carrying direction of the original plate P. The development region 11 has therein the discharge pipe 31 and the brush 41 and the rinse region 12 has therein the discharge pipe 32 and the brush 42.

In the development region 11, a developer is discharged from the discharge pipe 31 and supplied to the surface of the original plate P. The developer to be discharged here contains a used developer, meaning that it contains an infrared sensitive layer or photosensitive resin layer component removed. When the developer is an organic solvent, many components are dissolved in the developer. When the developer is a water-based developer, many infrared sensitive layer or photosensitive resin layer components are not dissolved in the water-based developer and are present as a solid or are dispersed in the water-based developer. It is to be noted that the developer to be discharged from the discharge pipe 31 may contain a liquid recovered by a separation and recovery device 7 which will be described later. The brush 41 rotates and the hair bundle thereof rubs the surface of the original plate P. The uncured photosensitive resin is thereby scraped out from the surface of the original plate P and is discharged together with the developer. The original plate P which has passed the development region 11 next reaches the rinse region 12.

In the rinse region 12, a rinse liquid is discharged from the discharge pipe 32 and supplied to the surface of the original plate P. The rinse liquid discharged here may contain an unused organic solvent in the case of organic solvent development, while it may contain either or both of water and a liquid recovered by the separation and recovery device 7 which will be described later in the case of water-based development. The roll brush 42 rotates and the hair bundle thereof rubs the surface of the original plate P. This removes the infrared sensitive layer or photosensitive resin layer component which has adhered to the surface of the original plate P, or removes the surfactant contained in the developer when water is used as the rinse liquid in the water-based development.

Such an original plate P subjected to development processing with the development device 1 has swollen with the developer or water. The original plate P is subjected to drying treatment with a dryer not shown. In the drying treatment, spraying with high-temperature air accelerates drying of the original plate P. The dried original plate P is then subjected to post-exposure with UVA and UVC and the resulting plate is used as a flexographic printing plate.

The development device 1 may further have, as shown in FIG. 1, a waste-liquid-processing supply mechanism 5 and a water-processing supply mechanism 6.

The waste-liquid-processing supply mechanism 5 is configured to supply a developer to the development region 11 and has a drain pan 51, a recovered-liquid reservoir tank 52, a filter device 54, and a filtrate reservoir tank 56, each placed below the discharge pipe 31.

The drain pan 51 is placed at a site below the carrier unit 2 and corresponding to the development region 11. The drain pan 51 is configured to recover a development waste liquid discharged downward from the development region 11.

The recovered-liquid reservoir tank 52 is a container capable of storing a liquid therein. The recovered-liquid reservoir tank 52 stores therein a development waste liquid which has been recovered from the drain pan 51 and has flown in the tank. The developer in the recovered-liquid reservoir tank 52 contains the infrared sensitive layer or photosensitive resin layer components scraped out and removed from the surface of the original plate P in the development region 11. The infrared sensitive layer or photosensitive resin layer components thus removed are dissolved and/or dispersed in the development waste liquid.

In the water-based development, a portion of the developer stored in the recovered-liquid reservoir tank 52 is sucked by a pump **53*b* via a suction pipe 53*a* and fed to a filter device 54 via a feeding pipe 53*c*. The filter device 54 has, therein, a filter not shown. The developer fed by the feeding pipe 53*c* is supplied in the filter device 54** and passes the filter. When the developer passes the filter, friction with the filter occurs and the surfactant is thereby removed from the surface of a resin residue dispersed in the developer. Thereby, in the developer which has passed the filter, coagulation of the resin residue occurs without addition of a coagulant to form an aggregate. Such a development residue such as the aggregate and the resin residue will hereinafter be called "debris".

The used debris-containing developer in the filter device 54 contains debris is fed to a filtrate reservoir tank 56 via a feeding pipe 55. The filtrate reservoir tank 56 is a container capable of storing a liquid therein. The filtrate reservoir tank 56 has a filter 56*a* placed therein. The developer to be fed by the feeding pipe 55 is supplied to the filtrate reservoir tank 56 and passes the filter 56*a*. When the developer passes the filter 56*a*, much debris contained in the developer can be removed. The filtrate reservoir tank 56 stores therein such a developer from which coagulable debris is removed by the filter 56*a* to reduce the debris concentration in the developer.

A portion of the filtered developer stored in the filtrate reservoir tank 56 is sucked by a pump 57*b* via a suction pipe 57*a* and returned to the recovered-liquid reservoir tank 52 via a feeding pipe 57*c*. The concentration of the debris in the recovered-liquid reservoir tank 52 decreases because the developer from which the debris has been removed is supplied from the filtrate reservoir tank 56. A portion of the developer in the recovered-liquid reservoir tank 52 is fed to the separation and recovery device 7 via the waste liquid pipe 52*a* and is subjected to mist processing. The separated and recovered liquid is returned into the recovered-liquid reservoir tank 52 and is reusable as a developer. The debris concentration of the developer in the recovered-liquid reservoir tank 52 is therefore decreased further.

The developer stored in the recovered-liquid reservoir tank 52 is sucked by a pump 58*b* via a suction pipe 58*a* and is supplied to the discharge pipe 31 of the development region 11 via a feeding pipe 58*c*. The discharge pipe 31 discharges the developer and supplies it to the original plate P placed in the development region 11. Described specifically, the developer is discharged toward two roll brushes 41 from one discharge pipe 31 and is supplied to the surface of the original plate P via the hair bundle of these roll brushes 41. The developer supplied in the development region 11 drops from the carrier unit 2, is recovered by the drain pan 51 as described above, and is subjected to debris removal treatment. This means that the developer supplied to the development region 11 is supplied for the development of the original plate P in repetition.

The water-processing supply mechanism 6 is configured to supply the rinse liquid to the rinse region 12. The water-processing supply mechanism 6 has a drain pan 61 and a water reservoir tank 62, each placed below the discharge pipe 32. The water reservoir tank 62 is, for example, a tank storing therein water supplied from tap water. The water reservoir tank 62 is a tank for storing therein, for example, water supplied from tap water. The water in the water reservoir tank 62 is sucked by a pump 63*b* via a suction pipe 63*a* and is supplied to the discharge pipe 32 in the rinse region 12 via a feeding pipe 63*c*. The discharge pipe 32 discharges water and supplies it to the original plate P placed in the rinse region 12. More specifically, water is discharged from one discharge pipe 32 to two roll brushes 42 and is supplied to the surface of the original plate P via the hair bundle of these roll brushes 42. The water supplied in the rinse region 12 drops from the carrier unit 2 and is recovered by the drain pan 61. The water recovered by the drain pan 61 is filtered through a filtering device, which is not shown, to remove an impurity and is returned to the water reservoir tank 62 for reuse as a rinse liquid. The liquid recovered by the separation and recovery device 7 is also sucked by a pump 78*b* and is returned to the water reservoir tank 62 via feeding pipes 78*a* and 78*c* for reuse as a rinse liquid.

The separation and recovery device 7 is configured to separate and recover the solvent from the development waste liquid which contains the development residue (debris) and is stored in the recovered-liquid reservoir tank 52 of the waste-liquid-processing supply mechanism 5.

The constitution of the separation and recovery device 7 of the present embodiment will hereinafter be described referring to FIGS. 2 to 11.

The separation and recovery device 7 of the present embodiment is for separating and recovering a solvent component from a development-residue-containing development waste liquid and it includes a waste-liquid heating mechanism (not shown) for heating a development waste liquid, an atomization chamber 71 having an ultrasonic element 71B for atomizing the development waste liquid heated by the waste-liquid heating mechanism into mists, and a mist recovery mechanism 72 for recovering the mists formed in the atomization chamber 71.

The development residue-containing development waste liquid is supplied from the outside to the atomization chamber 71 directly or via a storage chamber. The development waste liquid is heated to have an elevated temperature by a waste-liquid heating mechanism placed inside, outside, or both of the atomization chamber 71. Next, the development waste liquid supplied to the atomization chamber 71 is atomized in the air by the ultrasonic element 71B which the atomization chamber 71 has and thus, formed into mists. With air in the atomization chamber 71 as a carrier gas, the mists of the development waste liquid pass through a mist recovery port 71C which the atomization chamber 71 has in the upper portion thereof and are recovered by the mist recovery mechanism 72. The respective constituents of the separation and recovery device 7 will hereinafter be described in detail.

<Development Waste Liquid>

The development waste liquid to be processed by the separation and recovery device 7 of the present embodiment is, for example, a water-based development waste liquid generated by carrying out development with water containing at least a surfactant or an organic solvent-type development waste liquid containing a saturated or unsaturated hydrocarbon, an ester, an alcohol, or the like, each containing, as a development residue, a photosensitive resin having at least a polymer, a photopolymerizable unsaturated monomer, and an initiator. For the water-based development waste liquid, of the aforesaid waste liquids, a recovery device and a recovery method using the separation and recovery device 7 of the present embodiment is preferred because the latent heat of water is larger than that of an organic solvent. The following description will mainly be focused on a method using the water-based development waste liquid. The separation and recovery device 7 of the present embodiment is however applicable not only to the water-based development waste liquid but also the organic solvent-type development waste liquid.

<Waste-Liquid Heating Mechanism>

The separation and recovery device 7 of the present embodiment has a waste-liquid heating mechanism. The heating method of it is not particularly limited and it is possible to use, for example, a method of submerging a resistance heating type heater into a waste liquid, or a method of submerging, into a waste liquid, a pipe made of copper or aluminum having a high thermal conductivity or a pipe made of stainless steel having excellent corrosion resistance, each pipe having been poured with warm water or a heat medium. Heating the waste water by submerging, into a waste water, a pipe poured with warm water or a heat medium is preferred from the standpoint of suppressing a polymer from scorching to the surface of the heater. Heating the waste water reduces its viscosity and thereby markedly improves the atomization efficiency of not only water but also a surfactant in the waste liquid, making it possible to achieve a high processing capacity and a high surfactant concentration in a recovered liquid. The waste liquid is preferably heated to 35° C. or more and 90° C. or less from the standpoint of enhancing a recovery capacity and a surfactant concentration in the recovered liquid. The temperature is controlled to 90° C. or less in order to avoid a device trouble due to sudden boiling of the waste liquid. In addition, the waste-liquid heating mechanism preferably heats the water-based development waste liquid at a temperature that causes layer separation of the water-based development waste liquid in a static state. In such heating, the water-based development waste liquid in a static state can be separated into a waste liquid layer (layer containing a development residue) and a developer layer (a layer which is not the waste liquid layer but is composed mainly of water as a solvent). By atomizing the developer layer into mists and recovering the resulting mists by a mist recovery mechanism, the water-based developer can be recovered efficiently. When the waste liquid is heated and atomized, the waste liquid may be stirred or circulated between the atomization chamber and the storage chamber. In such a case, although the waste liquid does not seem (macroscopically) to be separated completely into a waste liquid layer and a developer layer even if it is heated to elevate the temperature to a layer-separation temperature, it is separated into a waste liquid layer and a developer layer microscopically so that the developer layer preferentially turns into mists by the atomization processing. This means that in the present embodiment, it is not always necessary to allow the waste liquid to stand when the waste liquid is heated at a layer-separation temperature or it is atomized. When the waste liquid is not allowed to stand, it is not separated completely into the waste liquid layer and the developer layer even if it reaches the layer-separation temperature but even in such a case, the water-based developer can be recovered efficiently by the atomization processing. The waste-liquid heating mechanism may be placed in the atomization chamber 71 or outside the atomization chamber 71.

<Atomization Chamber>

Figure 3:
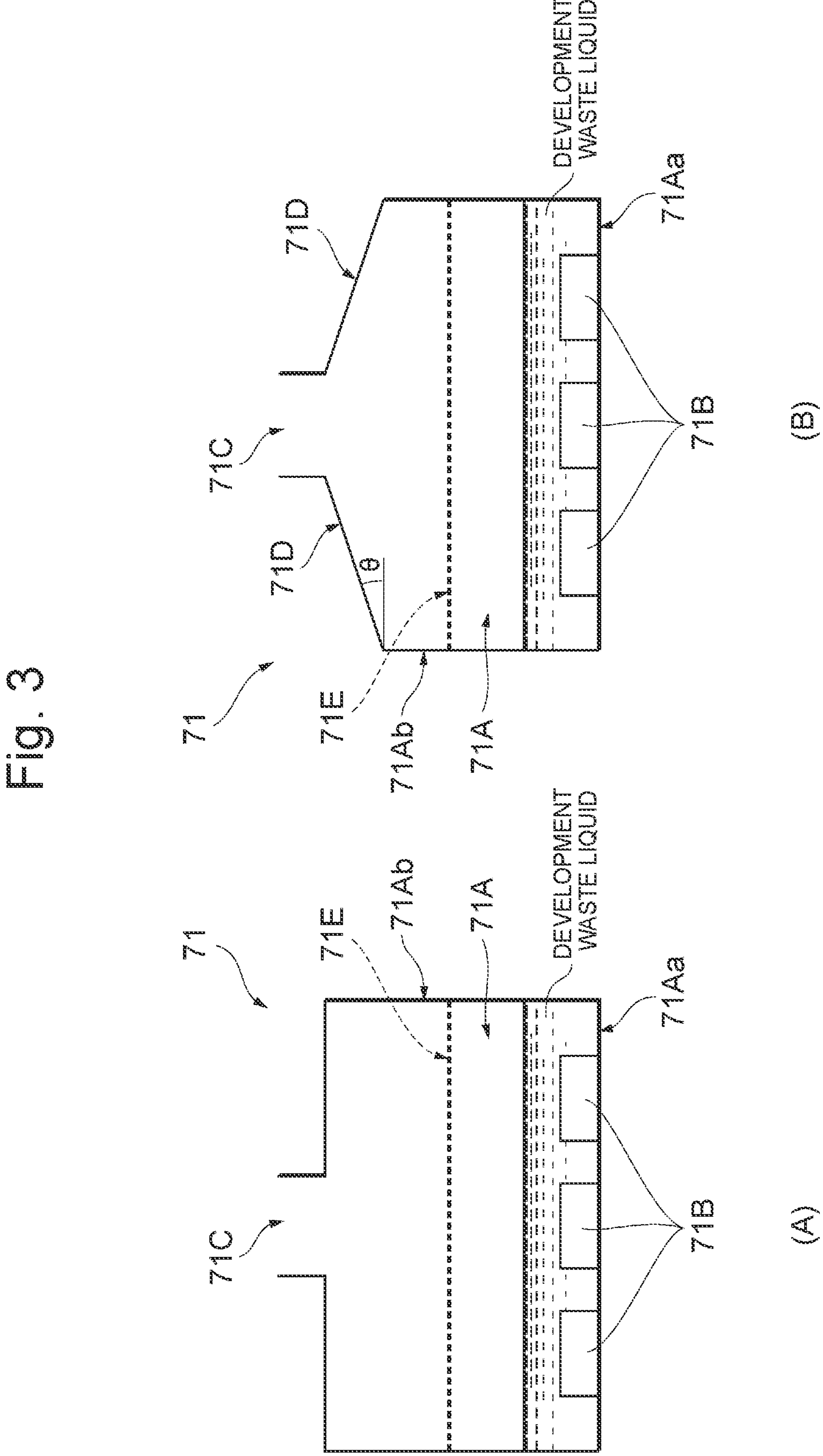
FIG. 3 is a cross-sectional view for describing the constitution of an atomization chamber which the separation and recovery device according to the embodiment of the present invention has.
Figure 4:
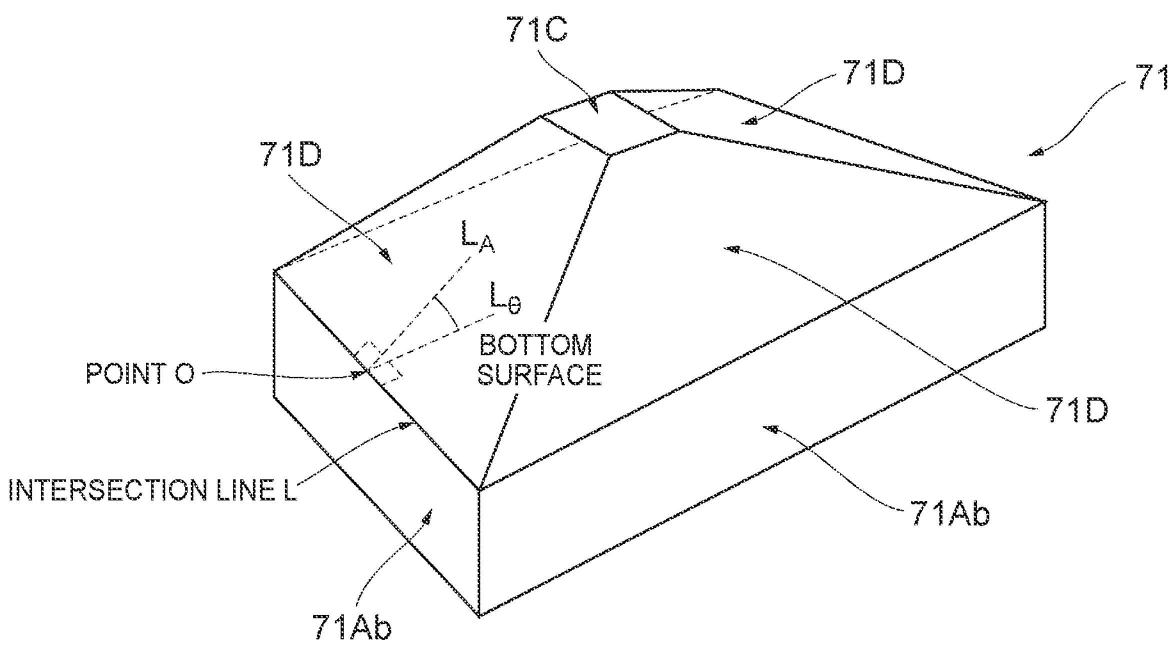
FIG. 4 is a perspective view for describing the steric structure of the atomization chamber which the separation and recovery device according to the embodiment of the present invention has.
Figure 5:
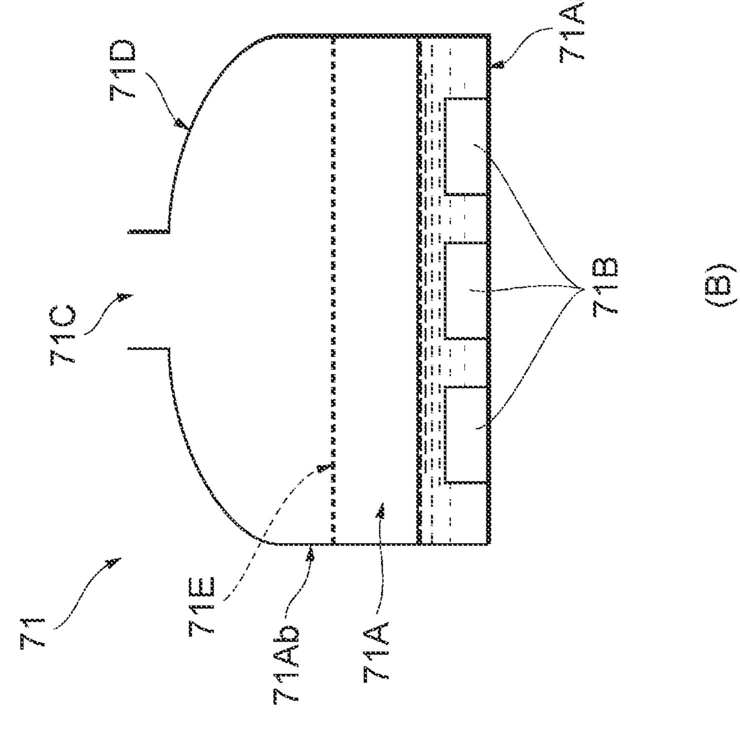
FIG. 5 is a cross-sectional view for describing a modification example of the constitution of the atomization chamber which the separation and recovery device according to the embodiment of the present invention has.
Figure 5:
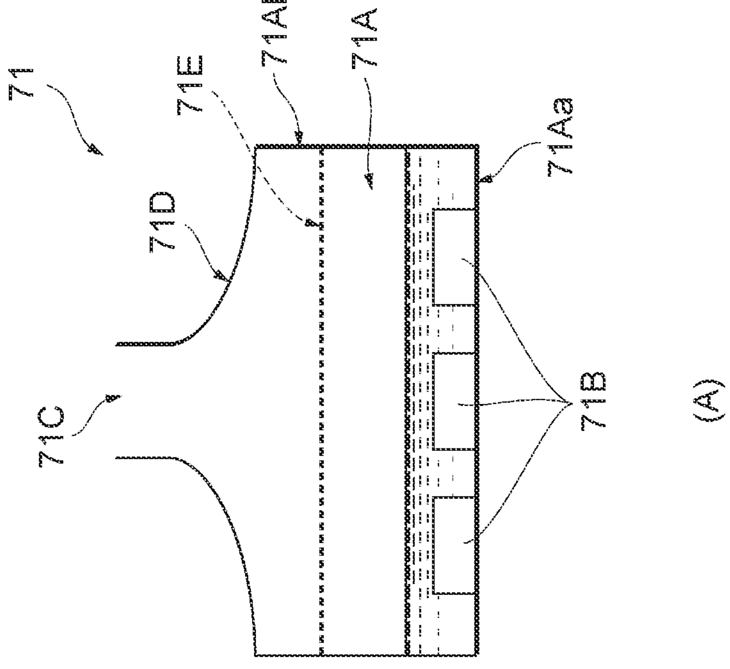

The atomization chamber 71 has, as shown in FIGS. 3 and 4, a reservoir space 71A for storing a development waste liquid therein and one or more ultrasonic elements 71B placed in the reservoir space 71A. The reservoir space 71A is a substantially tube-shaped space surrounded by a bottom wall 71A, side walls 71Ab connected to the periphery of the bottom wall 71Aa. In the present embodiment, as shown in FIGS. 3 and 4, a planar-view substantially rectangular bottom wall 71Aa and a substantially rectangular tube-shaped (substantially rectangular parallelepiped) reservoir space 71A are used. The planar shape of the bottom wall or the steric shape of the reservoir space is however not limited to them and, for example, a planar-view substantially-round bottom wall and a substantially-cylindrical reservoir space may be used.

As shown in FIG. 3, the ultrasonic element 71B can be placed below the reservoir space 71A. When a plurality of ultrasonic elements 71B is placed, the atomization chamber may further have parts for partitioning them or parts for controlling the air flow around the ultrasonic elements 71B. The atomization chamber 71 may further have a waste-liquid heating mechanism. As the waste-liquid heating mechanism to be placed in the atomization chamber 71, preferred is, for example, a mechanism of carrying out heating by submerging, into a waste liquid, a pipe which is made of copper or aluminum having a high thermal conductivity or a pipe made of a stainless steel having excellent corrosion resistance, each pipe having been poured with warm water or a heat medium. From the standpoint of corrosion resistance against the waste liquid, the atomization chamber 71 is preferably made of one or more of a stainless steel, aluminum, and polyvinyl chloride. The development waste liquid to be supplied to the atomization chamber 71 is heated to elevate its temperature by a waste-liquid heating mechanism placed outside or inside the atomization chamber 71.

In the reservoir space 71A of the atomization chamber 71, the liquid level height of the development waste liquid supplied therein is kept within a predetermined range. The term "predetermined range" means a liquid level height at which the development waste liquid is atomized efficiently by ultrasonic vibration emitted by the ultrasonic element 71B and it is determined by the performance or height of the ultrasonic element 71B or component or composition of the development waste liquid. The atomization chamber 71 has an outlet (not shown) in the bottom wall 71Aa or side wall 71 Ab and the development waste liquid overflows from it. By controlling this overflow amount, the liquid level height can be controlled. Alternatively, a liquid level sensor is placed in the reservoir space 71A of the atomization chamber 71 to control the output value of a development waste liquid supply pump based on the value detected by the sensor and thereby keep the liquid level height constant.

In addition, the atomization chamber 71 has, as shown in FIGS. 3 and 4, a mist recovery port 71C provided vertically above the reservoir space 71A in order to supply the mists formed by the ultrasonic element 71B in the reservoir space 71A to the mist recovery mechanism 72. In the present embodiment, as shown in FIG. 4, the mist recovery port 71C has a planar-view substantially-rectangular shape similar to the bottom wall 71Aa constituting the reservoir space 71A, but the planar shape of the mist recovery port is not limited thereto. For example, a planar-shape substantially-round mist recovery port can also be used. The planar shape of the bottom wall 71Aa and the planar shape of the mist recovery port 71C may not always be similar to each other.

The atomization chamber 71 of the present embodiment preferably has a tapered structure toward the mist recovery port 71C from the standpoint of enhancing the processing capacity of the chamber. This means that, as shown in FIG. 3(B) and FIG. 4, inclined walls 71D showing inclination to the planar-view center of the reservoir space 71A as they move vertically upward are connected to the respective upper ends of the side walls 71Ab constituting the reservoir space 71A of the atomization chamber 71 and the mist recovery port 71C is formed with the upper ends of these inclined walls 71D. In the present embodiment, as shown in FIG. 3(B) and FIG. 4, the side walls 71Ab are connected so that they extend vertically upward from the four sides of the planar-view substantially-rectangular bottom wall 71Aa, respectively and planar-view substantially-trapezoidal inclined walls 71D can be connected to the upper ends of these four side walls 71Ab, respectively. With the upper ends (portions of the upper side of the trapezoid) of these four inclined walls 71D, the planar-view substantially-rectangular mist recovery port 71C can be formed. Such a structure comprised of the inclined walls 71D gradually narrows (is tapered) in a side surface view as it moves vertically upward so that it will be called "tapered structure" herein.

When the atomization chamber does not have a tapered structure as shown in FIG. 3(A), a portion of the mists formed in the atomization chamber 71 accumulates at the upper corner in the atomization chamber 71 and is recondensed after collision between mists or collision between mists and the wall surface of the atomization tank, leading to a relative reduction in mist recovery efficiency. When the atomization chamber 71 has, in an upper portion thereof, a tapered structure as shown in FIG. 3(B), on the other hand, accumulation of the mists at the corner can be eliminated, leading to efficient recovery of the mists.

From the standpoint of enhancing an effect of suppressing the mist accumulation, a taper angle θ is preferably 15° or more (as shown in FIG. 4, the taper angle θ is defined as an angle between a plane (which will hereinafter be called "slope A") of the inclined wall 71D constituting the tapered structure and a virtual plane (which will hereinafter be called "bottom surface") formed by the upper end of the four side walls 71Ab. In other words, with respect to an angle between the slope A and the bottom surface, straight lines $L_A$ and $L_{bottom\ surface}$ which pass through an arbitrary point O on an intersection line (upper end of the side wall 71Ab) L of these two planes and are vertical to the intersection line L are drawn on the slope A and the bottom surface, respectively, and an angle between $L_A$ and $L_{bottom\ surface}$ is defined as an angle between the slope A and the bottom surface). On the other hand, when the inclination of the taper angle θ becomes too large, the height of the atomization chamber 71 becomes large and a distance between the liquid level of the development waste liquid and the mist recovery port 71C excessively increases, leading to a reduction in mist recovery efficiency. From the above standpoints, the taper angle θ is preferably 15° or more and 55° or less.

The tapered structure in the example shown in FIGS. 3(B) and 4 seems to be an apex-removed quadrangular pyramid structure. The shape of the bottom surface is not particularly limited and it may be a square, a rectangle, or a parallelogram, or it may a polygon or a circle. For example, when the atomization chamber has a rectangular bottom surface and the respective slopes A constituting the taper are different in taper angle θ, the minimum angle is defined as the taper angle θ of the design of the atomization chamber. In addition, the design other than the taper angle θ such as the length of each side and the volume of the atomization chamber 71 may be selected as needed in consideration of the using number of the ultrasonic elements 71B and the amount of the development waste liquid to be processed.

In the present embodiment, an example using a flat type inclined wall 71D is shown, but the inclined wall 71D is not necessarily flat. For example, an inclined wall 71D in the form of a curved plate convex in the downward direction as shown in FIG. 5(A) may be used or an inclined wall 71D in the form of a curved plate convex in the upward direction as shown in FIG. 5(B) may be used. Even if the inclined wall 71D is in the form of such a curved plate, it is possible to suppress the mists from accumulating in the upper corner of the atomization chamber 71.

Figure 6:
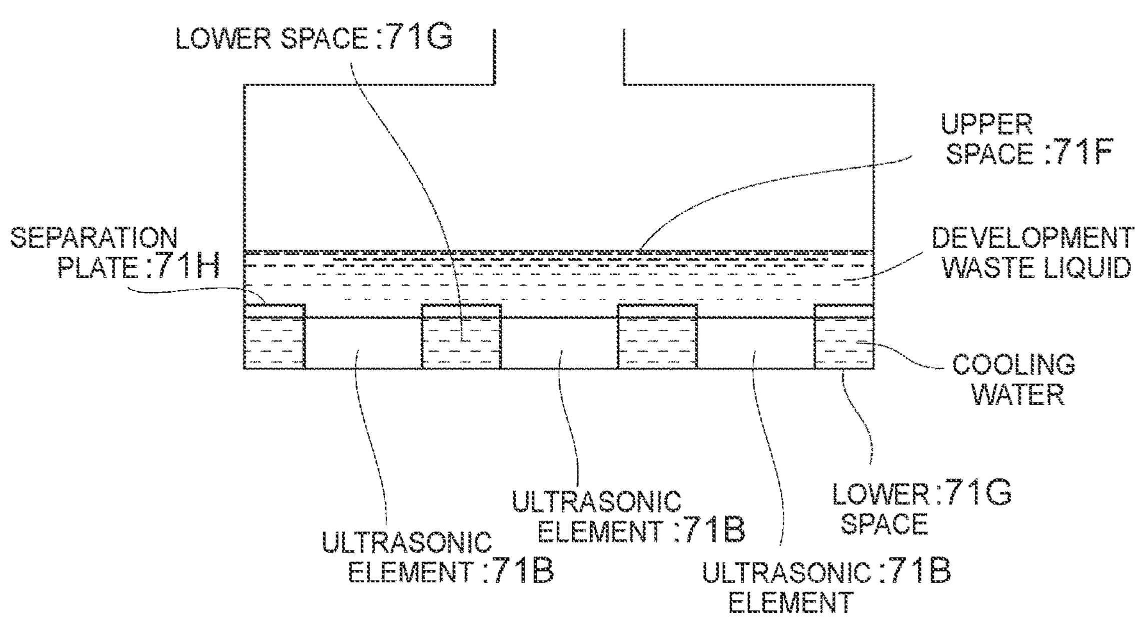
FIG. 6 is a cross-sectional view for describing a modification example (vertically-separated structure) of the constitution of the atomization chamber which the separation and recovery device according to the embodiment of the present invention has.

As another mode of the atomization chamber 71, a structure having an inner space separated into an upper space 71F and a lower space 71G as shown in FIG. 6 may be used. In this case, a development waste liquid is stored in the upper space 71F and at least one ultrasonic element 71B is placed in the lower space 71G. The development waste liquid is poured and stored in the upper space 71F by a pump, is overflown from an outlet (not shown), and is thus circulated. Between two ultrasonic elements 71B adjacent to each other in the lower space 71G, cooling water or a development waste liquid not warmed is poured from an inlet (not shown) and stored by a pump and is emitted from an outlet (not shown).

Figure 8:
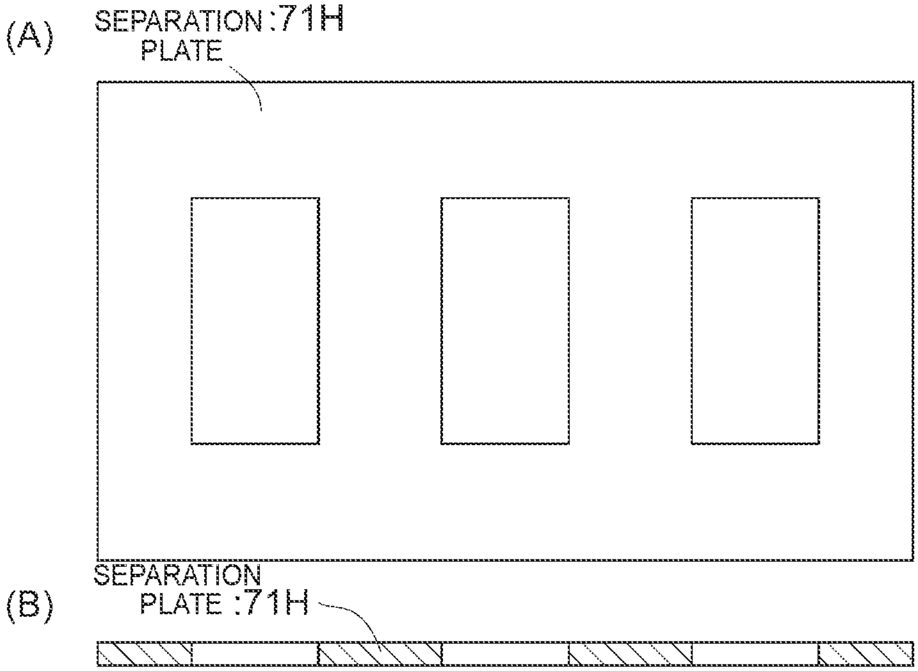
FIG. 8 shows a separation plate of the atomization chamber according to the modification example of FIG. 6, in which (A) is a top view and (B) is a cross-sectional view.

The upper space 71F and the lower space 71G are separated from each other by a separation plate 71H from which a portion corresponding to the upper surface of the ultrasonic element 71B has been hollowed out as shown in FIG. 8. The heated development waste liquid or self heat generated when the ultrasonic element 71B is put into operation gradually deteriorates the performance of the ultrasonic element 71B. In order to suppress such a deterioration in performance or slow down a performance deterioration speed, cooling of the ultrasonic element 71B is effective. It is therefore preferred to have a structure capable of pouring a cooling fluid into a space adjacent to the ultrasonic element 71B in the lower space 71G and thereby cooling the ultrasonic element 71B.

Figure 7:
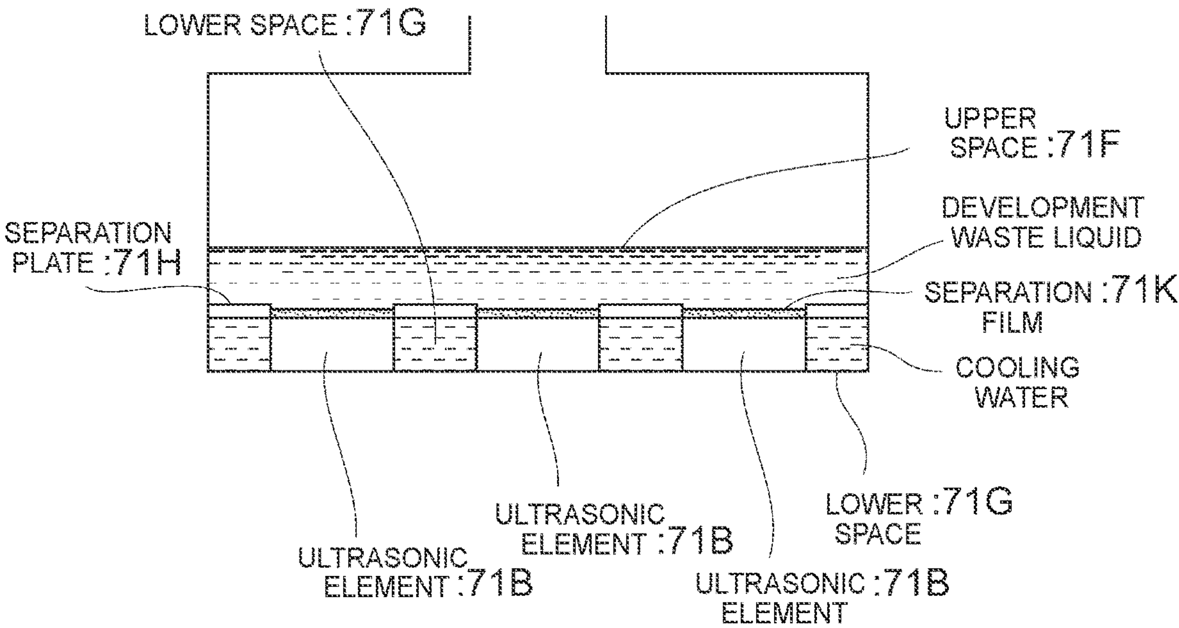
FIG. 7 is a cross-sectional view for describing a modification example (vertically-separated structure: with a separation film) of the constitution of the atomization chamber which the separation and recovery device according to the embodiment of the present invention has.
Figure 9:
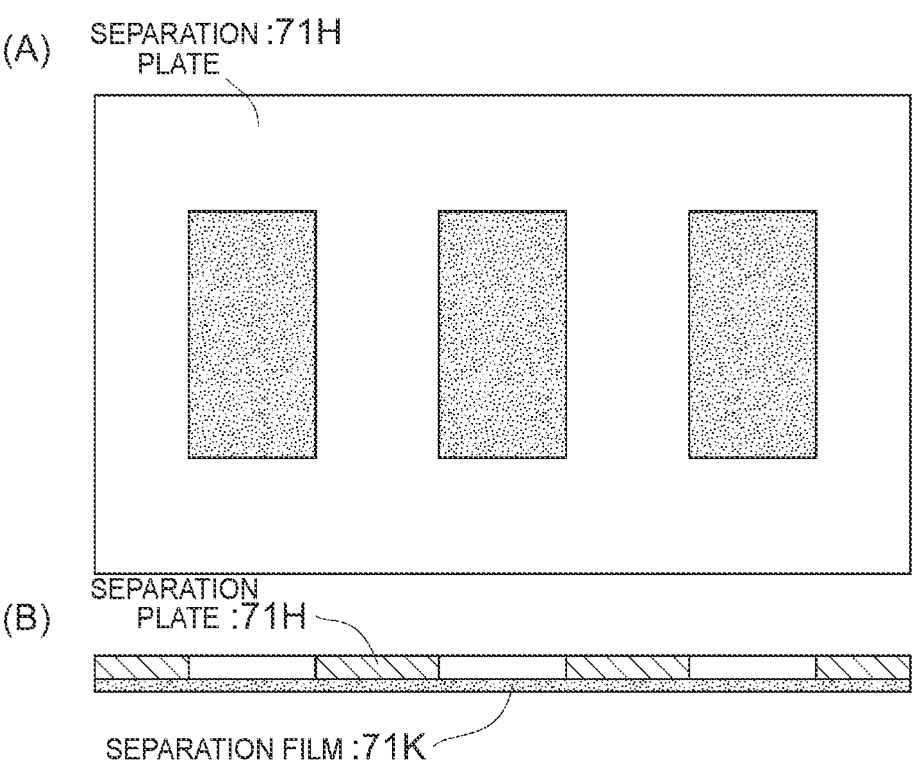
FIG. 9 shows a separation plate and a separation film of the atomization chamber according to the modification example of FIG. 7, in which (A) is a top view and (B) is a cross-sectional view.
Figure 10:
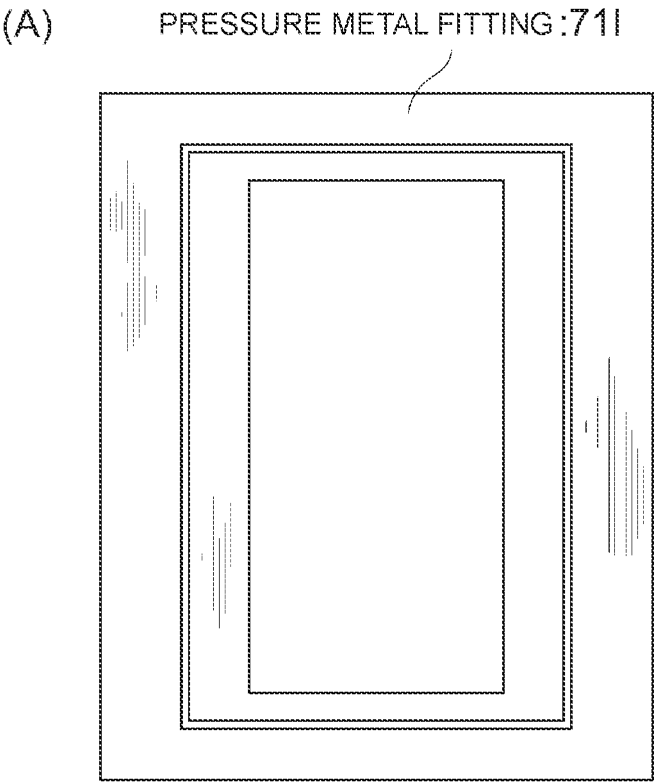
FIG. 10 shows a pressure metal fitting provided in the atomization chamber according to the modification example of FIG. 6, in which (A) is a top view and (B) is a cross-sectional view.
Figure 10:
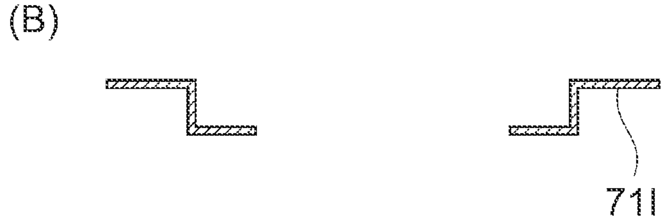
Figure 11:
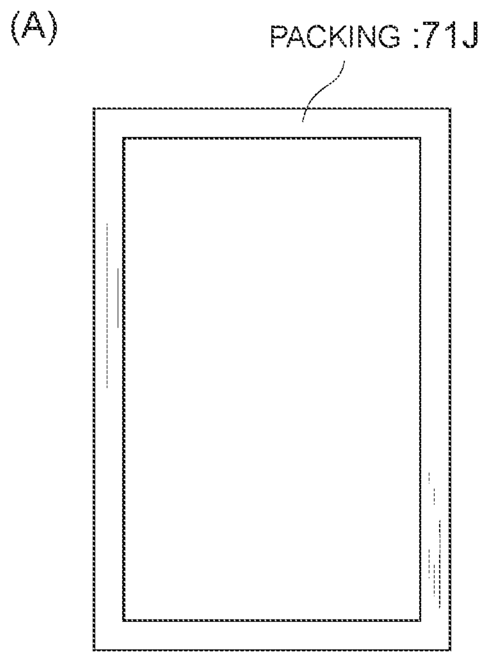
FIG. 11 shows a packing provided in the atomization chamber according to the modification example of FIG. 6, in which (A) is a top view and (B) is a cross-sectional view.
Figure 11:
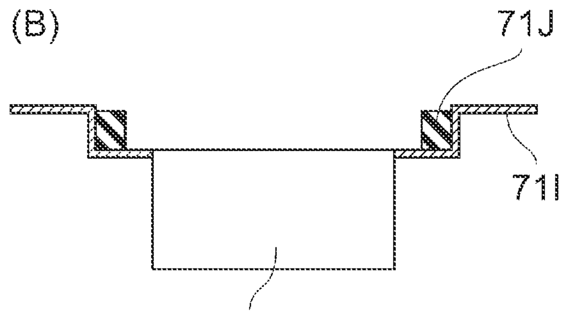

To prevent mixing of the respective fluids flowing in the upper space 71F and the lower space 71G, a pressure metal fitting 71I may be placed in addition between the ultrasonic element 71B and the separation plate 71H as shown in FIG. 10 and at the same time, a gap of them may be filled with a rubber packing 71J as shown in FIG. 11. Instead of such a structure, the upper space 71F may be separated from the lower space 71H by attaching, as shown in FIGS. 7 and 9, a separation film 71K thinner than the separation plate 71H on or under the separation plate 71H from which a portion corresponding to the upper surface of the ultrasonic element 71B has been hollowed out.

To prevent the heat transfer from the upper space 71F to the lower space 71G as much as possible, the separation plate 71H is preferably made of a material having a thermal conductivity (W/m·K) of 3 or less, more preferably 1 or less, and still more preferably 0.5 or less. The material of the separation plate 71H is not limited insofar as it has such a thermal conductivity and a resin material is preferred. Examples include polyethylene, polypropylene, polystyrene, polycarbonate-based resins, polyamide-based resins, polyvinyl chloride-based resins, poly(meth)acrylic resins, various rubber materials, and silicone resins. These resins may have enhanced strength or processability by kneading various plasticizers or inorganic materials therein. The thickness of the separation plate 71H is preferably 0.5 mm or more to 20 mm or less, more preferably 1 mm or more to 15 mm or less, and still more preferably 2 mm or more to 12 mm or less from the standpoint of thermal transfer from the upper space 71F to the lower space 71G.

When the separation film 71K is provided, it is preferably made of a material having an acoustic impedance close to that of water which is a main component of the development waste liquid, because the ultrasonic wave generated at the ultrasonic element 71B is transmitted to the development waste liquid via the separation film 71K. As the acoustic impedance of the separation film 71K is closer to that of water, a reflection amount of the ultrasonic wave generated at the ultrasonic element 71B by the separation film 71K decreases and a penetration amount therethrough increases. More specifically, the separation film 71K is preferably made of a material having an acoustic impedance of 500 or more and 5000 or less, more preferably 800 or more and 3000 or less, and still more preferably 1000 or more and 2000 or less. The material of the separation film 71K is not limited insofar as it has the above value and it is preferably a resin-based material. Examples include polyethylene, polypropylene, polystyrene, polycarbonate-based resins, polyamide-based resins, polyvinyl chloride-based resins, poly(meth)acrylic resins, various rubber-based materials such as EPDM, polybutadiene rubber, and silicone rubber, and silicone resins. The thickness of the separation film 71K is preferably 0.01 mm or more and 2 mm or less, more preferably 0.02 mm or more and 1.5 mm or less, and still more preferably 0.025 mm or more and 1 mm or less from the standpoint of the strength and ultrasonic absorption by the film.

For fixing the separation plate 71H and the separation film 71K, it is preferred to weld a support to the side wall 71Ab of the atomization chamber 71, insert a packing, and thereby fix the separation plate 71H or the separation film 71K. When only the separation plate 71H is used and the pressure metal fitting 71I present between the ultrasonic element 71B and the separation plate 71H is used, a support for fixing the pressure metal filling 71I may be used. Providing a packing 71J between the support and the pressure metal fitting is effective.

Thus, by separating the upper space 71F for storing the development waste liquid from the lower space 71G having the ultrasonic element 71B placed therein and thereby forming a structure capable of cooling the lower space 71G, a mist formation amount can be increased while suppressing the deterioration of the ultrasonic element 71B.

<Mist Recovery Mechanism>

Figure 2:
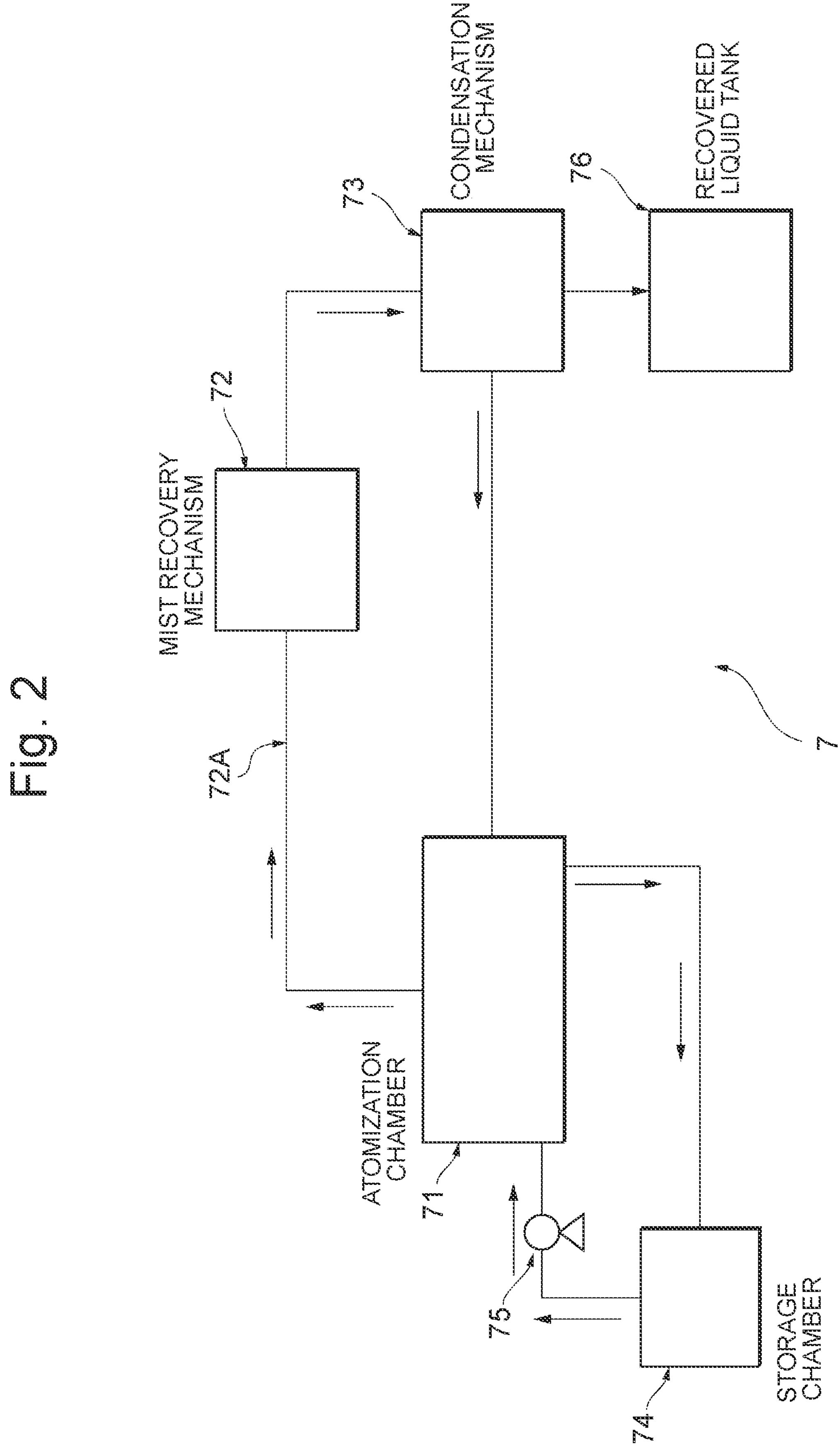
FIG. 2 is a schematic view for describing the overall structure of a separation and recovery device according to the embodiment of the present invention.

The separation and recovery device 7 of the present embodiment has a mist recovery mechanism 72 as shown in FIG. 2. The mists of the development waste liquid formed in the atomization chamber 71 pass through the mist recovery port 71C and are recovered by the mist recovery mechanism 72 with air as a carrier gas. Without the mist recovery mechanism 72, mists formed by the atomization of the development waste liquid have a large specific gravity relative to air so that they accumulate in the vicinity of the liquid surface of the development waste liquid, cause mist-mist collision and condensation, and inevitably drop in the development waste liquid again. Efficient recovery of the mists of the development waste liquid by the mist recovery mechanism 72 considerably improves a mist recovery efficiency and thereby achieves a high processing capacity. The mode of the mist recovery mechanism 72 is not particularly limited insofar as it can efficiently recover the mists of the development waste liquid with air as a carrier gas. The mists which have passed the mist recovery port 71C and the exhaust duct 72A above the atomization chamber 71 may be sucked or blown by a suction blower not shown or a blower provided between the aggregation mechanism 73 and the atomization chamber 71 in FIG. 2 and recovered by the aggregation mechanism 73.

<Mist Sorting Mechanism>

The separation and recovery device 7 of the present embodiment preferably has a mist sorting mechanism. It has been understood that ultrasonic vibration of the development waste liquid by the ultrasonic element 71B causes preferential atomization of a developer component such as water or surfactant but a development residue contained, though in a trace amount, in the development waste liquid is also atomized into mists. If all the mists are recovered, the recovered liquid inevitably contains the development residue, making it difficult to reuse the recovered liquid as a developer. As a means for overcoming the above problem, a mist sorting mechanism may be provided. The mist sorting mechanism can sort the mists, according to the size (diameter) or mass, or both of them, into a mist to be recovered from the mist recovery port 71C and a mist to be condensed and returned to the development waste liquid in the atomization chamber 71. Since the mists of the development waste liquid are larger in size or mass than the mists of water or surfactant, the recovered mists can be sorted by making use of their difference.

Examples of the mist sorting mechanism include a cyclone which sorts the recovered mists according to the mass thereof and are placed outside the atomization chamber 71 (for example, between the mist recovery port 71C and the mist recovery mechanism 72); and a punching board 71E (FIG. 3) which sorts the recovered mists according to both of the mass and size and are placed in the atomization chamber 71. It is preferred to place at least one layer of the punching board 71E in the atomization chamber 71 because it is simple and low cost and has a high separation efficiency of the development residue. As the position of the punching board, it may be placed between the liquid surface of the development waste liquid and the mist recovery port 71C as shown in FIG. 3. By placing the punching board 71E at the aforesaid position, mixing of the development residue in the recovered liquid can be suppressed. In addition, staining of the wall surface of the atomization chamber 71, mist recovery port 71C, a disposal duct 72A, and the like due to the recondensation of the mists containing the development residue can be suppressed.

The material of the punching board 71E is not particularly limited and examples include polyvinyl chloride and acrylic resins, stainless steel, and aluminum. The diameter of the hole is preferably 1 mm or more and 8 mm or less. When the hole has a diameter of 8 mm or less, the separation efficiency of the development residue is improved and mixing of the resin in the recovered liquid can be suppressed. From the standpoint of processability and strength of the punching board 71E, the diameter of the hole is preferably 1 mm or more.

The present inventors have found that an appropriately designed mist sorting mechanism placed in the atomization chamber 71 having the aforesaid tapered structure significantly improves the processing capacity. In other words, placing, in the atomization chamber 71 having the tapered structure, the punching board 71E having a hole diameter of 2 mm or more and 8 mm or less as the mist sorting mechanism brings about a significant improvement in processing capacity.

This mechanism can be presumed as follows. First, in efficiently recovering the mists formed in the atomization chamber 71, air flow in the atomization chamber 71 is very important. Described specifically, when the air flow is a so-called turbulent flow, collision between mists and the wall surface of the atomization chamber 71 or collision between mists is repeated to cause recondensation and this prevents efficient recovery from the mist recovery port 71C. It is presumed that the punching board 71E placed in the atomization chamber 71 adjusts the air flow to be closer to a streamline flow, decreases the frequency of the collision between mists and the wall surface of the atomization chamber 71 or between mists, and thereby suppresses the recondensation of the mists. The recovery amount is not improved only by using the punching board 71E and the atomization chamber 71 is required to have a tapered structure in addition, because the aforesaid adjustment of the air flow is thought to exhibit its effect only after the tapered structure is used to eliminate mist accumulation at the corner of the atomization chamber 71.

The present inventors have also found that when only the tapered structure is adopted, it improves the processing capacity but deteriorates the separation efficiency of the development residue and such a defect can be overcome by providing the mist sorting mechanism.

Thus, the mist sorting mechanism of the separation and recovery device 7 of the present embodiment is preferably at least one layer of the punching board 71E. More preferably, the punching board 71E has a hole diameter of 1 mm or more and 8 mm or less. Still more preferably, when the atomization chamber 71 has a tapered structure, the hole diameter of the punching board 71E is 2 mm or more and 8 mm or less. The aperture ratio of the punching board 71E is not particularly limited and can be selected from a range of, for example, 15% or more and 65% or less.

<Air Heating Mechanism>

The separation and recovery device 7 of the present embodiment preferably has an air heating mechanism. The air heating mechanism heats air to be supplied in the atomization chamber 71 to elevate its temperature. When the temperature of the air in the atomization chamber 71 is high, recondensation of the mists formed can be suppressed and the mists can be recovered efficiently. As a method of the air heating mechanism, the air in the atomization chamber 71 may be heated, for example, by a resistance heating type heater placed on the outside wall of the atomization chamber 71 or inside of the chamber. By a heater or a heat exchanger through which warm water has been passed, each being placed outside the atomization chamber 71, the air may be heated before it is supplied in the atomization chamber 71.

<Condensation Mechanism>

The separation and recovery device 7 of the present embodiment preferably has a condensation mechanism 73 as shown in FIG. 2. The condensation mechanism 73 is used for recondensing the mists recovered or blown by the mist recovery mechanism to efficiently obtain a recovered liquid. As a method of the condensation mechanism 73, for example, mists are aggregated by passing them through a heat exchanger supplied with cooling water to cool them or by forcibly bringing them into contact with each other by a demister or the like; and are then recovered as a liquid. The liquid recovered by the condensation mechanism 73 is fed to a recovered-liquid tank 76. The recovered liquid stored in the recovered-liquid tank 76 can be returned to a developing machine and reused. When the heat exchanger is used, the temperature of cooling water is adjusted to 20° C. or less from the standpoint of increasing the amount of the recovered liquid obtained by condensation. An air cooling type or water cooling type heat pump may be used for the cooling water.

<Waste-Liquid Circulation Mechanism>

As a method of supplying the waste liquid to the atomization chamber 71, commonly used is a method of continuously supplying the waste liquid to the atomization chamber 71 from the outside to perform mist processing and disposing an overflowing portion of a concentrated waste liquid (which method will hereinafter be called "continuous processing method"). It can be used for the separation and recovery device 7 of the present invention. From the standpoint of improving the heating efficiency of the waste liquid, suppressing a change in the component of the recovered liquid thus obtained, and controlling a concentration ratio freely, compared with the continuous processing method, however, the separation and recovery device 7 of the present invention preferably has a waste-liquid circulation mechanism and uses a batch processing method.

By carrying out the batch processing, the waste liquid can be heated efficiently and the processing capacity and the surfactant concentration in the recovered liquid can be enhanced, because sufficient time is secured for passing the waste liquid through the heating mechanism to heat and elevate its temperature. In addition, even when the component in the waste liquid supplied from the outside changes, a recovered liquid having almost constant components can be obtained. As one example of an operation method of the device, it is possible to repeat a step of supplying a predetermined amount of the waste liquid in a storage chamber 74 through the waste liquid pipe 52*a* from the outside (the recovered-liquid reservoir tank 52 of the waste-liquid processing supply mechanism 5 of the development device 1), starting batch processing, and after the waste liquid in the storage chamber 74 is concentrated to a predetermined amount or less, supplying a predetermined amount of the waste liquid in the storage chamber 74 from the outside again. After the aforesaid step is repeated and the frequency exceeds a specified one, the batch process is stopped and then, the concentrate in the storage chamber 74 can be disposed. From the standpoint of efficiently performing waste-liquid heating and enhancing the processing capacity and the surfactant concentration in the recovered liquid, the storage chamber 74 preferably further has therein a heating mechanism for heating the waste liquid.

Next, a method of using the separation and recovery device 7 of the present embodiment to separate and recover a solvent from a development waste liquid containing a development residue will be described. In the present embodiment, four separation and recovery methods (first, second, third, and fourth methods) are used. They may be described hereinafter in order.

<First Separation and Recovery Method>

First, the first separation and recovery method (which will hereinafter be called "first method") of the present embodiment will be described. The first method includes a heating step for heating a development waste liquid to 35° C. or more and or less, an atomization step for atomizing the development waste liquid heated in the heating step into mists, and a recovery step for recovering the mists formed in the atomization step. The first method can be used for separating and recovering a solvent (water) from a water-based development waste liquid generated by carrying out development with a water-based developer containing at least a surfactant and it can also be used for separating and recovering a solvent from a development waste liquid other than the water-based development waste liquid.

The heating step in the first method is to heat the development waste liquid to 35° C. or more to 90° C. or less by a waste-liquid heating mechanism provided inside or outside the atomization chamber 71 of the separation and recovery device 7. The waste liquid is heated while controlling the temperature to 90° C. or less in order to avoid a device trouble due to sudden boiling of the waste liquid. As already described above, the heating method is not particularly limited and usable examples include a method of submerging a resistance heating type heater into the waste liquid and a method of submerging, into the waste liquid, a pipe made of copper or aluminum having a high thermal conductivity or a pipe made of a stainless steel having excellent corrosion resistance, each pipe being poured with warm water or a heat medium. Since the waste liquid heated has a reduced viscosity, the heating causes a marked improvement in the atomization efficiency of not only water but also a surfactant in the waste liquid, making it possible to achieve a high processing capacity and a high surfactant concentration in a recovered liquid.

The atomization step is to atomize the development waste liquid heated in the heating step into mists in the atomization chamber 71 of the separation and recovery device 7. In the atomization chamber 71, as shown for example in FIGS. 3 to 5, the development waste liquid stored in the reservoir space 71A is atomized by ultrasonic vibration caused by the ultrasonic element 71B to form mists. With air as a carrier gas, the mist thus formed passes from the mist recovery port 71C provided vertically above the reservoir space 71A and sent to the mist recovery mechanism 72.

When in the atomization step, the atomization chamber 71 having a structure in which the upper space 71F for storing the development waste liquid is separated from the lower space 71G having the ultrasonic element 71B placed therein is used, atomization is preferably carried out while pouring, in the lower space 71G, cooling water or the development waste liquid before heating with a pump and thereby cooling the ultrasonic element 71B. The temperature of the lower space 71G is preferably 10° C. or more and 40° C. or less and more preferably 15° C. or more and 35° C. or less. The temperature is preferably 10° C. or more because excessive cooling of the lower space 71G leads to an increase in cooling energy and dewing occurs particularly in summer. By adjusting the temperature to 40° C. or less, the deterioration of the ultrasonic element 71B can be suppressed. The temperature of the development waste liquid is heated to 35° C. or more and 90° C. or less so that the temperature of the lower space 71G can be changed by the temperature of the development waste liquid. When the temperature of the development waste liquid is 35° C. or more and 50° C. or less, a temperature difference between the upper space 71F and the lower space 71G is preferably adjusted to 5° C. or more and 40° C. or less. When the temperature of the development waste liquid is 50° C. or more and 90° C. or less, a temperature difference between the upper space 71F and the lower space 71G is preferably adjusted to 15° C. or more and 70° C. or less. The temperature difference is widened with an increase in the temperature of the development waste liquid. By the aforesaid method, the deterioration of the ultrasonic element can be suppressed while increasing the formation amount of mists.

The recovery step is to recover the mist formed in the atomization step by the mist recovery mechanism 72 of the separation and recovery device 7. Without the mist recovery mechanism 72, the mists formed by the atomization of the development waste liquid accumulate in the vicinity of the liquid surface of the development waste liquid because of a specific gravity larger than that of air and after collision and condensation of the mists, they drop in the development waste liquid again. The mist recovery mechanism 72 can recover the mists of the development waste liquid efficiently so that it markedly improves a mist recovery efficiency and achieves a high processing capacity. The mode of the mist recovery mechanism 72 is not particularly limited insofar as it can efficiently recover the mists of the development waste liquid with air as a carrier gas. By providing, for example, the tapered structure as shown in FIG. 3(B) in the upper portion of the atomization chamber 71, accumulation of the mists at the corner can be avoided and the mists can be recovered efficiently.

By using the first method, a solvent obtained by removing the development residue from the development waste liquid can be recovered by forming mists by atomizing the development waste liquid with the ultrasonic element and then recovering the resulting mists by the mist recovery mechanism 72. In the first method, the development waste liquid is heated by the waste-liquid heating mechanism prior to atomization so that a recovered liquid having a high solvent concentration can be obtained with a high processing capacity.

<Second Separation and Recovery Method>

Next, the second separation and recovery method (which will hereinafter be called "second method") of the present embodiment will be described. The second method is to separate and recover a solvent from a water-based development waste liquid generated by carrying out development with a water-based developer containing at least a surfactant. It includes a heating step for heating a water-based development waste liquid at a temperature (layer-separation temperature) that causes layer separation of the water-based development waste liquid in a static state, an atomization step for atomizing the development waste liquid heated in the heating step into mists, and a recovery step for recovering the mists formed in the atomization step. The atomization step and the recovery step are substantially similar to those of the first method so that a detailed description of them is omitted.

The heating step in the second method is to heat the water-based development waste liquid at a layer-separation temperature. The water-based development waste liquid may be heated in a fluid state (for example, in a stirred or circulated state) and the waste liquid in such a state does not always cause layer separation even heated at the layer-separation temperature. In the heating step, therefore, the water-based development waste liquid may be just heated at the layer-separation temperature and it is not always required to actually cause layer separation. As the layer-separation temperature, usable is a predicted temperature calculated based on the formula (4) or (5) and used in the third separation and recovery method which will be described later or a predicted temperature calculated based on the formula (6) or (7) and used in the fourth separation and recovery method which will be described later.

The minimum layer-separation temperature is preferably 90° C. or less, more preferably 80° C. or less, still more preferably 70° C. or less, and particularly preferably 60° C. or less. A lower minimum layer-separation temperature is preferred because layer separation occurs more easily. The lower limit of the minimum layer-separation temperature is not particularly limited and it may be, for example, 25° C., 30° C., 35° C., or 40° C. The range of the minimum lower separation temperature may be, for example, 25 to 90° C., 30 to 80° C., 35 to 70° C., or 40 to 60° C. The minimum layer-separation temperature depends on the composition of the water-based development waste liquid.

The second method further includes, prior to the heating step, an adjustment step for obtaining an adjusted waste liquid by carrying out at least one adjustment selected from the group consisting of the following (A) to (D):

(A) increasing the pH of the water-based development waste liquid, (B) adding a layer separation accelerator to the water-based development waste liquid, (C) removing a portion of a development residue from the water-based development waste liquid, and (D) removing a portion of a surfactant from the water-based development waste liquid.

As the layer separation accelerator, a compound represented by the following formula (1), a compound represented by the following formula (2), or a combination of them may be used.

Formula (1)

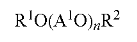

$$R^1O(A^1O)_nR^2$$

(wherein, $R^1$ and $R^2$ each independently represent an alkyl group having 2 to 6 carbon atoms or an alkenyl group having 2 to 6 carbon atoms, preferably an alkyl group having 2 to 6 carbon atoms, and more preferably an alkyl group (butyl group) having 4 carbon atoms; $A^1$ represents an alkylene group having 2 to 4 carbon atoms, preferably an alkylene group having 2 or 3 carbon atoms and more preferably an alkylene group ($—CH_2CH_2—$) having 2 carbon atoms; and n is an integer of 1 to 5, preferably an integer of 1 to 3, and more preferably 2)

Formula (2)

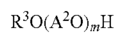

$$R^3O(A^2O)_mH$$

(wherein, $R^3$ represents an alkyl group having 3 to 8 carbon atoms or an alkenyl group having 3 to 8 carbon atoms, preferably an alkyl group having 3 to 8 carbon atoms, and more preferably an alkyl group (hexyl group) having 6 carbon atoms; $A^2$ represents an alkylene group having 2 to 4 carbon atoms, preferably an alkylene group having 2 or 3 carbon atoms, and more preferably an alkylene group ($—CH_2CH_2—$) having 2 carbon atoms; and m is an integer of 1 to 5, preferably an integer of 1 to 3, and more preferably 2).

The minimum layer-separation temperature can be reduced by using such a layer separation accelerator.

In the second method, when layer separation cannot be caused easily because the minimum layer-separation temperature of the water-based development waste liquid is high, the adjustment step is performed to reduce the minimum layer-separation temperature. This makes it possible to cause layer separation easily and recover the water-based developer efficiently.

Adjustment (A) in the adjustment step is to increase the pH of the water-based development waste liquid. An increase in the pH of the water-based development waste liquid tends to reduce the minimum layer-separation temperature. A method of increasing the pH of the water-based development waste liquid is not particularly limited and examples include a method of adding an inorganic base to the water-based development waste liquid (specific examples of the inorganic base may be described later).

The adjustment (B) in the adjustment step is to add the layer separation accelerator to the water-based development waste liquid. As the concentration of the layer separation accelerator in the water-based development waste liquid increases, the minimum layer-separation temperature tends to decrease.

The adjustment (C) in the adjustment step is to remove a portion of the development residue from the water-based development waste liquid. As the concentration of the development residue in the water-based development waste liquid decreases, the minimum layer-separation temperature tends to decrease. The method of removing a portion of the development residue from the water-based development waste liquid is not particularly limited and examples include a method of filtering the water-based development waste liquid through a filter.

The adjustment (D) in the adjustment step is to remove a portion of a surfactant in the water-based development waste liquid. As the concentration of the surfactant in the water-based development waste liquid decreases, the minimum layer-separation temperature tends to decrease. The method of removing a portion of a surfactant from the water-based development waste liquid is not particularly limited and examples include a method of making use of the binding ability of the surfactant to a hydrophobic resin, causing the surfactant to adsorb to the hydrophobic resin immersed in the water-based development waste liquid, and thus removing the surfactant.

In the adjustment step, only Adjustment (A), only Adjustment (B), only Adjustment (C), or only Adjustment (D) may be performed. In the adjustment step, they may be used in the following combination: Adjustments (A)+(B), Adjustments (A)+(C), Adjustments (A)+(D), Adjustments (B)+(C), Adjustments (B)+(D), Adjustments (C)+(D), Adjustments (A)+(B)+(C), Adjustments (A)+(B)+(D), Adjustments (A)+(C)+(D), Adjustments (B)+(C)+(D), or Adjustments (A)+(B)+(C)+(D).

In the adjustment step, the minimum layer-separation temperature of the adjusted waste liquid may be adjusted to be preferably 90° C. or less, more preferably or less, still more preferably 70° C. or less, and particularly preferably 60° C. or less. Lower minimum layer-separation temperatures are preferred because layer separation occurs more easily. The lower limit of the minimum layer-separation temperature is not particularly limited and examples include 25° C., 30° C., 35° C., and 40° C. The range of the minimum layer-separation temperature may be, for example, to 90° C., 30 to 80° C., 35 to 70° C., or 40 to 60° C.

The water-based development waste liquid to be processed in the second method contains a surfactant, a development residue, and water (solvent). The surfactant preferably has a cloud point of 40° C. or less. By using the surfactant having a cloud point of 40° C. or less, the minimum layer-separation temperature can be reduced to the aforesaid specified value. The cloud point may be, for example, to 40° C., 20 to 40° C., or 30 to 40° C.

The surfactant is preferably represented by the following formula (3):

Formula (3)

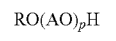

$$RO(AO)_pH$$

(wherein, R represents an alkyl group or aryl group having 10 to 20 carbon atoms, A represents an alkylene group having 2 to 4 carbon atoms, and p is an integer of 1 to from the standpoint of separating the water-based development waste liquid into a waste layer phase and a developer phase while suppressing mixing of the development residue in the developer phase and thereby suppressing mixing of a resin in the recovered liquid. In the above formula, R preferably represents an alkyl group or aryl group having 10 to 18 carbon atoms, A preferably represents an alkylene group having 2 to 4 carbon atoms, and p is preferably an integer of 6 to 10.

In the formula (3), when p is 2 or more, As may be the same or different from each other. When p is 2 or more, the $(AO)_p$ in the formula (1) may form a random polymer or may form a block polymer.

In the formula (3), R represents an alkyl group or aryl group having 10 to 20 carbon atoms. The alkyl group may be either linear or branched and examples include methyl, ethyl, n-propyl, isopropyl, n-butyl, isobutyl, sec-butyl, tert-butyl, n-pentyl, isopentyl, neopentyl, n-hexyl, n-heptyl, n-octyl, n-nonyl, n-decyl, capryl, lauryl, myristyl, pentadecyl, palmityl, palmitoyl, and stearyl groups. Examples of the aryl group include phenyl and naphthyl groups. The aryl groups may include polycyclic phenyl groups such as biphenyl and triphenyl.

Examples of the alkylene group having 2 to 4 carbon atoms in the formula (3) include ethylene, propylene, and butylene groups.

The alkyl groups or aryl groups having 1 to 20 carbon atoms and the alkylene groups having 2 to 4 carbon groups in the formula (3) include a group having a substituent. Examples of the substituent include halogen atoms such as fluorine and chlorine atoms and $C_1$ to $C_6$ alkyl groups such as methyl, ethyl, n-propyl and isopropyl groups.

Of the polyalkylene glycols represented by the formula (3), polyoxyalkylene alkyl ethers and polyoxyalkylene polycyclic phenyl ethers are more preferred.

(Polyoxyalkylene Alkyl Ether)

The polyoxyalkylene alkyl ether is preferably represented by the following formula (3-1) or (3-2):

Formula (3-1)

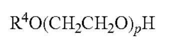

Formula (3-2)

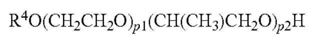

In the formula (3-1), $R^4$ represents an alkyl group having 1 to 20 carbon atoms and p is a number of 1 to 50.

In the formula (3-2), $R^4$ represents a hydrogen atom or an alkyl group having 1 to 20 carbon atoms and the sum of p1 and p2 is a number of 1 to 50. A $-(CH_2CH_2O)_{p1}(CH(CH_3)CH_2O)_{p2}-$ portion may be either a random polymer or a block polymer.

As the polyoxyalkylene alkyl ether, a commercially available product may be used. The commercially available polyoxyalkylene alkyl ether is not particularly limited and examples include Newcol (registered trademark) NT-3, Newcol NT-5, Newcol NT-7, Newcol NT-9, Newcol NT-12, Newcol 2302, Newcol 2303, Newcol 1203, Newcol 1204, Newcol 2303-Y, Newcol 2304-YM, Newcol 2304-Y, polyoxyethylene 2-ethylhexyl ether (Newcol 1004, Newcol 1006, and Newcol 1008), polyoxyethylene tridecyl ether (Newcol 1305), Newcol 2306-Y, Newcol 2306-HY, Newcol 2308-Y Newcol 2308-LY, Newcol 708, Newcol 709, Newcol 82, Newcol 85, Newcol 1210, and Newcol 1902-Y.

Of these, surfactants having a cloud point of 40° C. or less include Newcol NT-7 (33° C.), Newcol 2303-Y (38° C.), Newcol 2306-HY (32° C.), Newcol 2308-LY (38° C.), and Newcol 1902-Y (33° C.).

(Polyoxyalkylene Polycyclic Phenyl Ether)

The polyoxyalkylene polycyclic phenyl ether is preferably represented by the following formula (3-3):

Formula (3-3)

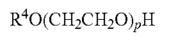

In the formula (3-3), $R^4$ is a polycyclic phenyl and p is a number of 1 to 50.

As the polyoxyalkylene polycyclic phenyl ether, a commercially available product can be used. The commercially available polyoxyalkylene polycyclic phenyl ether is not particularly limited and examples include Newcol 703, Newcol 704, and Newcol 2604.

The surfactant is preferably contained in the water-based development waste liquid in an amount of 0.1 mass % or more from the standpoint of keeping the development performance. The water-based development waste liquid may contain a plurality of surfactants.

The water-based development waste liquid to be processed in the second method may further contain an inorganic base. The inorganic base makes layer separation easier to cause by its salting-out effect and reduces the minimum layer-separation temperature. The inorganic base may also function as a pH regulator. Examples of the inorganic base include lithium hydroxide, sodium hydroxide, potassium hydroxide, calcium hydroxide, lithium carbonate, sodium carbonate, potassium carbonate, cesium carbonate, lithium hydrogen carbonate, sodium hydrogen carbonate, potassium hydrogen carbonate, cesium hydrogen carbonate, potassium fluoride, sodium fluoride, cesium fluoride, lithium chloride, and lithium bromide.

The minimum layer-separation temperature of the water-based development waste liquid depends on the composition of the water-based development waste liquid so that the surfactant, development residue, water, inorganic base, and layer separation accelerator are preferably contained in the water-based development waste liquid in such an amount that the minimum layer-separation temperature of the water-based development waste liquid is the aforesaid specified value.

When the second method is used, a water-based development waste liquid generated by carrying out development with a water-based developer containing at least a surfactant is heated at a certain temperature (temperature causing layer separation of the water-based development waste liquid in a static state) so that a water-based developer containing a very small amount of the development residue can be recovered efficiently.

<Third Separation and Recovery Method>

Next, the third separation and recovery method (which will hereinafter be called "third method") of the present embodiment will be described. The third method is to separate and recover a solvent from a water-based development waste liquid generated by carrying out development with a water-based developer containing at least a surfactant. It includes a heating step for heating a water-based development waste liquid at a temperature predicted to cause layer separation of the water-based development waste liquid in a static state, an atomization step for atomizing the development waste liquid heated in the heating step into mists, and a recovery step for recovering the mists formed in the atomization step. The water-based development waste liquid contains a surfactant having a cloud point of 40° C. or less, an inorganic base, a development residue, and water. The predicted temperature is a temperature predicted based on the concentration of the development residue in the water-based development waste liquid, the concentration of the surfactant in the water-based development waste liquid, and the pH of the water-based development waste liquid. The atomization step and the recovery step are substantially similar to those of the first method so that a detailed description of them is omitted.

The details of the surfactant and the inorganic base in the third method are as described above in the second method.

The heating step in the third method is to heat the water-based development waste liquid at a predicted temperature. The heating step is only required to heat the water-based development waste liquid at the predicted temperature and this step does not always include a step (predicting step) of calculating the predicted temperature.

The predicted temperature can be predicted based on the concentration of the development residue in the water-based development waste liquid, the concentration of the surfactant in the water-based development waste liquid, and the pH of the water-based development waste liquid. More specifically, with a decrease in the concentration of the development residue, the predicted temperature tends to decrease; with a decrease in the concentration of the surfactant, the predicted temperature tends to decrease; and with an increase in the pH of the water-based development waste liquid, the temperature tends to decrease.

The predicted temperature is preferably a temperature T (° C.) of the water-based development waste liquid satisfying the following formulas (4) and (5). In the following formulas, W represents the concentration (mass %) of the development residue in the water-based development waste liquid; Ca represents the concentration (mass %) of the surfactant in the water-based development waste liquid; and the pH is a pH of the water-based development waste liquid. Since these W, Ca, and pH are values determined definitively for each water-based development waste liquid, the values of T at which the formulas (4) and (5) hold are all predicted temperatures and the minimum value of T at which the formulas (4) and (5) hold is the minimum predicted temperature. Layer separation can be caused by heating the water-based development waste liquid at the minimum predicted temperature or more. However, from the standpoint of keeping power consumption low and obtaining an economical advantage during processing of the waste liquid, the waste-liquid heating temperature in the heating step is preferably (a minimum predicted temperature+20)° C. or less.

[Math. 7]

$$\frac{1}{1+\exp(-z)} \geq 0.5 \qquad \text{Formula (4)}$$

[Math. 8]

$$z = -0.60713385 \times \frac{W - 2.03591046}{1.56737401407577} - 1.27547875 \times \frac{Ca - 2.45178061}{1.26267792013641} + 0.93568397 \times \frac{\mathrm{pH} - 10.09333333}{0.301256627} + 3.17537577 \times \frac{T - 51.25}{7.96476616} + 3.30903047 \qquad \text{Formula (5)}$$

The formulas (4) and (5) are obtained, as shown later in Examples, by the logistic regression analysis based on the data of many water-based development waste liquids. In the logistic regression analysis, the concentration of the development residue in the water-based development waste liquid, the concentration of the surfactant in the water-based development waste liquid, the pH of the water-based development waste liquid, and the temperature of the water-based development waste liquid are selected as an explanatory valuable and the presence or absence of layer separation of the water-based development waste liquid is selected as a criterion valuable. The formula (4) is a monotone increasing function with respect to z and z is a linear combination of W, Ca, pH, and T. The formula (4) can be understood as a discriminant for determining whether or not phase separation occurs. It can be determined that phase separation occurs when the left-hand side value becomes 0.5 or more.

The concentration of the development residue as an explanatory variable relates to layer separation and at the same time, the regression coefficient of it is minus (in other words, with an increase in the concentration of the development residue, layer separation is harder to occur). This mechanism can be presumed as follows.

A photosensitive resin layer constituting a printing original plate may contain various components. When a hydrophobic resin is used as one of the components, addition of hydrophilicity enables development with a water-based developer. Examples of a method of adding a hydrophilic component to a hydrophobic component include using, as a main component, a resin obtained by modifying a hydrophobic polymer with a carboxylic acid or salt thereof; using, as a main component, a mixture of a hydrophobic component composed mainly of a hydrophobic polymer and a hydrophilic component composed mainly of a hydrophilic polymer; using, as a main component, a chemically bonded product of a hydrophobic polymer and a hydrophilic polymer; and using, as a main component, a polymer obtained by block copolymerization of a hydrophobic monomer which will be a raw material of a hydrophobic polymer with a hydrophilic monomer which will be a raw material of a hydrophilic polymer. A photosensitive flexographic type obtained by using, in some form, a hydrophobic component in combination with a hydrophilic component and made dispersible in the water-based developer is particularly preferred.

The development residue (unexposed resin) dispersed in the water-based development waste liquid therefore has both a hydrophilic component and a hydrophobic component. The development residue dispersed in the water-based developer is presumed to have some influence on the bonding of the surfactant and water. More specifically, bonding between water and a hydrophilic component of the development residue, bonding between water and a hydrophilic component of the surfactant, and bonding between the hydrophobic component of the surfactant and the hydrophobic component of the development residue are formed respectively and as a result, the development residue enters between the water and the surfactant to thereby enhance the bonding force between the water and the surfactant. It is presumed that according to the aforesaid mechanism, the concentration of the development residue in the water-based development waste liquid increases and suppresses phase separation.

The concentration of the surfactant in the water-based development waste liquid as an explanatory variable relates to layer separation and at the same time, the regression coefficient of it is minus (in other words, with an increase in the concentration of the surfactant, layer separation is harder to occur). The reason is presumed that the surfactant is a material causing layer separation and at an excessively high surfactant concentration, the bonding force between the surfactant and water or the bonding force between the surfactant and the development residue, or both of them becomes stronger due to an increase in micelle size to suppress easy phase separation.

The pH of the water-based development waste liquid as an explanatory variable relates to layer separation and the regression coefficient of it is plus (in other words, with an increase in the pH, layer separation is more likely to occur). The reason is presumed that with an increase in pH, the concentration of a salt contained in the inorganic base as a pH regulator increases and a salting-out effect of it facilitates layer separation.

The temperature T of the water-based development waste liquid as an explanatory variable relates to layer separation and at the same time, the regression coefficient of it is plus (in other words, with an increase in the temperature, layer separation is more likely to occur). The reason is presumed that when the temperature of the water-based development waste liquid is elevated, a hydrogen bond between the hydrophilic group of the surfactant compound and water is broken to facilitate layer separation.

The minimum predicted temperature is preferably 90° C. or less, more preferably 80° C. or less, still more preferably 70° C. or less, and particularly preferably or less. Lower minimum predicted temperatures are preferred because layer separation occurs easily thereat. The lower limit of the minimum predicted temperature is not particularly limited and it may be, for example, 25° C., 30° C., 35° C., or 40° C. The range of the minimum predicted temperature may be, for example, 25 to 90° C., 30 to 80° C., 35 to 70° C., or 40 to 60° C.

Since the minimum predicted temperature of the water-based development waste liquid depends on the composition of the water-based development waste liquid, the surfactant, the development residue, water, and the inorganic base are preferably contained in the water-based development waste liquid in such an amount that the minimum predicted temperature of the water-based development waste liquid is the aforesaid specified value.

The third method does not always require prediction of a temperature but it may further include, prior to the heating step, a step (predicting step) of calculating a predicted temperature based on the concentration of the development residue in the water-based development waste liquid, the concentration of the surfactant in the water-based development waste liquid, and the pH of the water-based development waste liquid. In the predicting step, the predicted temperature is preferably determined based on the formulas (4) and (5). When the predicting step is not performed, the heating temperature may be determined based on a preliminary experiment, the intuition or experience of an operator, or any other method or ground and eventually, the water-based development waste liquid is heated preferably within a range of the predicted temperature determined based on the formulas (4) and (5).

Prior to the heating step in the third method, the adjustment step described in the second method may be performed. At this time, the adjusted waste liquid is obtained by not performing Adjustment (B) of adding a layer separation accelerator but performing at least any one of (A) (increasing the pH of the water-based development waste liquid), (C) (removing a portion of the development residue from the water-based development waste liquid) and (D) (removing a portion of the surfactant from the water-based development waste liquid).

When the third method is used, a water-based development waste liquid generated by carrying out development with a water-based developer containing at least a surfactant is heated at a certain temperature (temperature predicted to cause layer separation of the water-based development waste liquid in a static state) so that a water-based developer containing a very small amount of the development residue can be recovered efficiently.

<Fourth Separation and Recovery Method>

Next, the fourth separation and recovery method (which will hereinafter be called "fourth method") of the present embodiment will be described. The fourth method is to separate and recover a solvent from a water-based development waste liquid generated by carrying out development with a water-based developer containing at least a surfactant. It includes a heating step for heating a water-based development waste liquid at a temperature predicted to cause layer separation of the water-based development waste liquid in a static state, an atomization step for atomizing the development waste liquid heated in the heating step into mists, and a recovery step for recovering the mists formed in the atomization step. The water-based development waste liquid contains a surfactant having a cloud point of or less, an inorganic base, a development residue, water, and a layer separation accelerator. The predicted temperature is a temperature predicted based on the total concentration of the development residue in the water-based development waste liquid, the concentration of the surfactant in the water-based development waste liquid, the pH of the water-based development waste liquid, and the concentration of the layer separation accelerator in the water-based development waste liquid. The atomization step and the recovery step are substantially similar to those of the first method so that a detailed description of them is omitted.

The layer separation accelerator is the compound represented by the formula (1) and/or the compound represented by the formula (2), each described above in the second method. Details of the surfactant, the inorganic base, and the layer separation accelerator in the fourth method are as described in the second method.

The heating step in the fourth method is to heat the water-based development waste liquid at the predicted temperature. The heating step is only required to heat the water-based development waste liquid at the predicted temperature and it does not always necessary to include a predicted-temperature calculation step (predicting step).

The predicted temperature can be determined based on the concentration of the development residue in the water-based development waste liquid, the concentration of the surfactant in the water-based development waste liquid, the pH of the water-based development waste liquid, and the total concentration of the compounds represented by the formulas (1) and (2) in the water-based development waste liquid. More specifically, with a decrease in the concentration of the development residue, the predicted temperature tends to decrease; with a decrease in the concentration of the surfactant, the predicted temperature tends to decrease: with an increase in the pH of the water-based development waste liquid, the predicted temperature tends to decrease; and with an increase in the total concentration of the compounds represented by the formulas (1) and (2), the predicted temperature tends to decrease.

The predicted temperature is preferably a temperature T (° C.) satisfying the following formulas (6) and (7). In the following formulas, W represents the concentration (mass %) of the development residue in the water-based development waste liquid; Ca represents the concentration (mass %) of the surfactant in the water-based development waste liquid; the pH is the pH of the water-based development waste liquid; and Cb represents the total concentration (mass %) of the compounds represented by the formulas (1) and (2) in the water-based development waste liquid. Since W, Ca, pH, and Cb in the formulas are values determined definitively for each water-based development waste liquid, the values of T at which the formulas (6) and (7) hold are all predicted temperatures and the minimum value of T at which the formulas (6) and (7) hold is the minimum predicted temperature. Layer separation occurs by heating the water-based development waste liquid at the minimum predicted temperature or more. From the standpoint of keeping power consumption low and gaining an economical advantage during processing of the waste liquid, the waste-liquid heating temperature in the heating step is preferably (minimum predicted temperature+20)° C. or less.

[Math. 9]

$$\frac{1}{1+\exp(-z)} \geq 0.5 \qquad \text{Formula (6)}$$

[Math. 10]

-continued

Formula (7)

$$z = -0.60713385 \times \frac{W - 2.03591046}{1.56737401407577} - 1.27547875 \times \frac{Ca - 2.45178061}{1.26267792013641} + 0.93568397 \times \frac{\mathrm{pH} - 10.09333333}{0.301256627} + 1.45202002 \times \frac{Cb - 0.71332546}{0.303775970083218} + 3.17537577 \times \frac{T - 51.25}{7.96476616} + 3.30903047$$

The formulas (6) and (7) are obtained, as shown later in Examples, by the logistic regression analysis based on the data of many water-based development waste liquids. In the logistic regression analysis, the concentration of the development residue in the water-based development waste liquid, the concentration of the surfactant in the water-based development waste liquid, the pH of the water-based development waste liquid, the total concentration of the compounds represented by the formulas (1) and (2) in the water-based development waste liquid, and the temperature of the water-based development waste liquid are selected as an explanatory valuable and the presence or absence of layer separation of the water-based development waste liquid is selected as a criterion valuable.

The relation between the layer separation and the concentration of the development residue, the concentration of the surfactant, the pH of the water-based development waste liquid, and the temperature of the water-based development waste liquid each selected as the explanatory variable has already been described above in the relation in the formulas (4) and (5) in the third method.

The total concentration of the compounds represented by the formulas (1) and (2) in the water-based development waste liquid, as the explanatory variable, relates to layer separation and at the same time, the regression coefficient of it is plus (this means that an increase in the total concentration of the compounds represented by the formulas (1) and (2) raises the probability of layer separation). This occurs presumably because the alkyleneoxy group of the compounds represented by the formulas (1) and (2) and water bond to each other to disturb bonding of the surfactant and water and makes layer separation likely to occur.

The minimum predicted temperature of the water-based development waste liquid is preferably 90° C. or less, more preferably 80° C. or less, still more preferably 70° C. or less, and particularly preferably 60° C. or less. Lower minimum predicted temperatures are preferred because layer separation occurs easily thereat. The lower limit of the minimum predicted temperature is not particularly limited and it may be, for example, 25° C., 30° C., 35° C., or 40° C. The range of the minimum predicted temperature may be, for example, 25 to 90° C., 30 to 80° C., 35 to 70° C., or 40 to 60° C.

Since the minimum predicted temperature of the water-based development waste liquid depends on the composition of the water-based development waste liquid, the surfactant, the development residue, water, the inorganic base, and the compounds represented by the formula (1) and (2) are preferably contained in the water-based development waste liquid in such an amount that the minimum predicted temperature of the water-based development waste liquid is the aforesaid specified value.

The fourth method does not always require the determination of a predicted temperature but it may include further, prior to the heating step, a step (predicting step) of calculating a predicted temperature based on the concentration of the development residue in the water-based development waste liquid, the concentration of the surfactant in the water-based development waste liquid, the pH of the water-based development waste liquid, and the total concentration of the compounds represented by the formulas (1) and (2) in the water-based development waste liquid. In the predicting step, the predicted temperature is determined based on the formulas (6) and (7). When the predicting step is not performed, the heating temperature may be determined based on a preliminary experiment, the intuition or experience of an operator, or any other method or ground and eventually, the water-based development waste liquid is heated preferably within a range of the predicted temperature determined based on the formulas (6) and (7).

Prior to the heating step in the fourth method, the adjustment step (to obtain an adjusted waste liquid by carrying out at least any one of Adjustments (A) to (D)) described in the second method may be performed. Since addition of the layer separation accelerator to the water-based development waste liquid is allowed in the fourth method, different from the third method, an adjusted waste liquid may be obtained by Adjustment (B), that is, adding the layer separation accelerator.

By adopting the fourth method in which a water-based development waste liquid generated by carrying out development with a water-based developer containing at least a surfactant is heated at a certain temperature (temperature predicted to cause layer separation of the water-based development waste liquid in a static state), a water-based developer containing a very small amount of the development residue can be recovered efficiently.

The first to fourth methods may include a mist sorting step for sorting mists formed in the atomization step into a mist to be recovered and a mist to be recondensed and then returned in the development waste liquid according to the size and/or mass of the mists. By carrying out this mist sorting step, at least a portion of the development residue in the development waste liquid can be separated from the development waste liquid and a solvent may be recovered while reducing the mixing amount of the development residue therein. The mist sorting step may be performed using the aforesaid mist sorting mechanism (for example, a cyclone for sorting the recovered mists according to their mass and a punching board 71E for sorting the recovered mists according to both their mass and size).

In addition, the first to fourth methods may further include a step of returning an overflowing portion of the development waste liquid—which has been sent to the atomization chamber 71 from the storage chamber 74 for storing the development waste liquid supplied from the outside and has remained after the atomization processing—to the storage chamber 74 and sending it to the atomization chamber 71 again. By such a step, the development waste liquid containing the development residue is subjected to mist processing while being circulated between the atomization chamber 71 and the storage chamber 74 and thus, the solvent component is recovered and gradually concentrated.

A developer recycling method according to the present embodiment will next be described. The present method is to supply the solvent recovered by any of the (first to fourth) separation and recovery methods of the present embodiment to the development device 1 of the present embodiment and reuse it as a portion of the developer supplied from the developer supply unit (discharge pipe 31) and/or a portion of the rinse liquid supplied from the rinse liquid supply unit (discharge pipe 32). Using such a method enables reduction of the amount of the development waste liquid and the using amount of a new developer.

Next, a method of producing a water-based developer according to the present embodiment will be described. The present method is to produce a new developer and/or rinse liquid by using the solvent recovered by any of (the first to fourth) separation and recovery methods of the present embodiment.

A method of producing a printing plate according to the present embodiment will next be described. The present method includes a step of irradiating a printing original plate with infrared rays to form a pattern, a step of irradiating the printing original plate having the pattern thereon with ultraviolet rays to expose the pattern, and a step of removing a portion which has remained unexposed in the exposure step with the water-based developer produced by the method of producing a water-based developer according to the present embodiment.

EXAMPLES

<Overall Constitution of Waste Liquid Recovery Device>

With respect to Examples of the separation and recovery device 7 of the present invention, the overall constitution will hereinafter be described, but this invention is not limited by Examples shown below. In the following Examples, a technically preferable limitation in enforcing the present embodiment is imposed but this limitation is not an indispensable requirement for this invention.

The separation and recovery device 7 is equipped with a waste-liquid circulation mechanism as shown in FIG. 2 and it uses a batch processing system. Described specifically, a development waste liquid supplied from the outside is stored in the storage chamber 74, supplied to the atomization chamber 71 by the pump 75, and is subjected to atomization processing by the ultrasonic element 71B placed in the atomization chamber 71. An overflowing portion of the development waste liquid from the outlet is sent to the storage chamber 74 and the atomization chamber 71 again and it is concentrated while being circulated. This separation and recover device 7 is equipped further with a suction blower as the mist recovery mechanism 72 and a thermal exchanger, as the condenser mechanism 73, through which cooling water of about 8° C. is run. After mists are recovered by the suction blower, they are cooled and condensed in the heat exchanger and then recovered in the recovered-liquid tank 76. The dry air after the mist recovery is sent to the atomization chamber 71 again.

Examples 1 to 20

First, Examples 1 to 20 corresponding to the first separation and recovery method will be described.

The development waste liquid is a waste liquid generated by developing an original plate by the development device 1. A water-based developer containing water and a surfactant contains a development residue. The mass percent concentrations of the surfactant and the development residue were measured by the following method to be 4.3% and 1.2%, respectively.

<Measurement Method of a Development Residue Concentration and a Surfactant Concentration>

The mass percent concentrations of the surfactant and the development residue are measured respectively by weighing a development waste liquid before and after drying and hardening it and thereby finding a nonvolatile content. More specifically, after a predetermined amount of the development waste liquid is collected and filtered through a membrane filter having a pore size of 0.8 μm to remove a development residue, a weight W1 is measured. Next, after the development waste liquid is dried and hardened in a thermostatic chamber of 40° C., a weight W2 of a nonvolatile component is measured and a surfactant concentration is obtained by calculating the formula $(W2/W1)\times 100$. Similarly, after a predetermined amount of the development waste liquid is collected again, a weight W3 is measured without filtering it through the membrane filter. After the development waste is dried and hardened in a thermostat of 40° C., W4 of the nonvolatile component is measured. The value obtained by subtracting the aforesaid surfactant concentration from the nonvolatile matter concentration determined from $(W4/W3)\times 100$ is the concentration of the development residue.

The separation and recovery of the aforesaid development waste liquid are performed using the separation and recovery device 7 shown in FIG. 2. A recovery amount was determined by carrying out processing for 3 minutes while turning the ultrasonic element 71B ON and weighing the recovered liquid accumulated in the recovered-liquid tank 76. The surfactant concentration and development residue concentration in the recovered liquid were each determined by the aforesaid measurement method.

Example 1

Atomization processing was performed after placing a waste-liquid heating mechanism in the atomization chamber 71 and heating the development waste liquid to 40° C. As the waste-liquid heating mechanism, a stainless-steel pipe poured with warm water was submerged into the waste liquid. As the atomization chamber 71, a design of a rectangular parallelepiped (105 cm long, 45 cm wide, and 40 cm high) without a tapered structure as shown in FIG. 3(A) was adopted. The measurement results of a recovery amount, a surfactant concentration in the recovered liquid, and a development residue concentration after 3-minute processing are shown in Table 1.

In Table 1, "×" means that the measurement results are not preferable (recovery amount: less than 0.15 L, surfactant concentration: less than 0.75%), 'A' means that the measurement results are preferable (recovery amount: 0.15 L or more and less than 0.3 L, surfactant concentration: 0.75% or more and less than 1.5%, development residue concentration: 0.8% or more and less than 1.0%), "0" means that the measurement results are more preferable (recovery amount: 0.3 L or more and less than 0.45 L, surfactant concentration: 1.5% or more, development residue concentration: 0.6% or more and less than 0.8%), "◎o" means that the measurement results are still more preferable (recovery amount: 0.45 L or more and less than 0.6 L, development residue concentration: 0.4% or more and less than and "◎o" means that the measurement results are most preferable (recovery amount: 0.6 L or more, development residue concentration: less than 0.4%).

Example 2

The separation and recovery device 7 of the present Example uses an atomization chamber 71 as shown in FIGS. 3(B) and 4 and having a taper angle of 23° (a tapered portion: a structure obtained by cutting the top portion of a square pyramid having a 105-cm long and 45-cm wide bottom surface, lower portion: a 105-cm long, wide, and 20-cm high parallelepiped). By using a device constitution and performing atomization processing similar to those of Example 1 except for the design of the atomization chamber, a recovery amount, a surfactant concentration in the recovered liquid, and a development residue concentration after 3-minute processing were measured. The results are shown in Table 1.

Examples 3 to 6

In the present Examples, a recovery amount, a surfactant concentration in the recovered liquid, and a development residue concentration after 3-minute processing were measured using a device constitution and performing atomization processing similar to those of Example 2 except that the taper angle of the atomization chamber 71 of the separation and recovery devices 7 was changed to 15°, 50°, 60°, and 10°, respectively. The results are shown in Table 1.

Examples 7 to 11

In the present Examples, the atomization chambers 71 of the separation and recovery devices 7 have, as a mist sorting mechanism, punching boards 71E as shown in FIG. 3 and having holes with a diameter of 1 mm, 2 mm, 3 mm, 8 mm, and mm, respectively. Using a device constitution and performing atomization processing similar to those of Example 1 except for the aforesaid point, a recovery amount, a surfactant concentration in the recovered liquid, and a development residue concentration after 3-minute processing were measured. The results are shown in Table 1.

Examples 12 to 18

In the present Examples, the atomization chambers 71 of the separation and recovery devices 7 have, as a mist sorting mechanism, punching boards 71E as shown in FIG. 3 and having holes with a diameter of 1 mm, 2 mm, 3 mm, 4 mm, 6 mm, 8 mm, and 10 mm, respectively. In addition, in any of these Examples, the atomization chambers 71 have a taper angle of 23° (a tapered portion: a structure obtained by cutting the top portion of a square pyramid having a 105-cm long and wide bottom surface, a lower portion: a 105-cm long, 45-cm wide, and 20-cm high parallelepiped). Using a device constitution and performing atomization processing similar to those of Example 1 except for the aforesaid points, a recovery amount, a surfactant concentration in the recovered liquid, and a development residue concentration after 3-minute processing were measured. The results are shown in Table 1.

Example 19

The separation and recovery device 7 of the present Example had, between the condensation mechanism 73 and the atomization chamber 71, a thermal exchanger through which warm water was run as an air heating mechanism so that dry air coming from the condensation mechanism 73 was supplied to the atomization chamber 71 after heated to 25° C. Using a device constitution and performing atomization processing similar to those of Example 1 except for the aforesaid point, a recovery amount, a surfactant concentration in the recovered liquid, and a development residue concentration after 3-minute processing were measured. The results are shown in Table 1.

Example 20

The separation and recovery devices 7 of the present Example had an atomization chamber 71 as shown in FIGS. 3(B) and 4 and having a taper angle of 23° (a tapered portion: a structure obtained by cutting the top portion of a square pyramid having a 105-cm long and 45-cm wide bottom surface, lower portion: a 105-cm long, 45-cm wide, and 20-cm high parallelepiped); had, in the atomization chamber 71, a punching board 71E (hole diameter: 4 mm) as shown in FIG. 3(B); and had an air heating mechanism (heat exchanger through which warm water was run) to supply dry air to the atomization chamber 71 after heating to 25° C. Using a device constitution and performing atomization processing similar to those of Example 1 except for the aforesaid points, a recovery amount, a surfactant concentration in the recovered liquid, and a development residue concentration after 3 minute-processing were measured. The results are shown in Table 1.

Comparative Example 1

The present Comparative Example does not have a waste-liquid heating mechanism so that a development waste liquid having a room temperature is supplied to an atomization chamber and is subjected to atomization processing. By using a device constitution and performing atomization processing similar to those of Example 1 except for the aforesaid point, a recovery amount, a surfactant concentration in the recovered liquid, and a development residue concentration after 3-minute processing were measured. The results are shown in Table 1.

TABLE 1

| Ex./ Comp. Ex. | Waste liquid heating | Air heating | Punching | Taper | Taper angle | Bottom surface of atomization chamber | Amount of recovered liquid | Surfactant concen-tration | Develop-ment residue concen-tration | Recovered amount | Surfactant concen-tration | Develop-ment residue concen-tration |
|---|---|---|---|---|---|---|---|---|---|---|---|---|
| Comp. Ex. 1 | No | No | No | No | — | Rectangle (105-cm long and 45-cm wide) | 0.13 | 0.62 | 0.65 | X | X | ○ |
| Ex. 1 | Yes | No | No | No | — | Rectangle (105-cm long and 45-cm wide) | 0.29 | 1.22 | 0.61 | Δ | Δ | ○ |
| Ex. 2 | Yes | No | No | Yes | 23° | Rectangle (105-cm long and 45-cm wide) | 0.43 | 1.21 | 0.81 | ○ | Δ | Δ |
| Ex. 3 | Yes | No | No | Yes | 15° | Rectangle (105-cm long and 45-cm wide) | 0.36 | 1.25 | 0.80 | ○ | Δ | Δ |

TABLE 1-continued

| Ex./ Comp. Ex. | Waste liquid heating | Air heating | Punching | Taper | Taper angle | Bottom surface of atomization chamber | Amount of recovered liquid | Surfactant concen-tration | Develop-ment residue concen-tration | Recovered amount | Surfactant concen-tration | Develop-ment residue concen-tration |
|---|---|---|---|---|---|---|---|---|---|---|---|---|
| Ex. 4 | Yes | No | No | Yes | 50° | Rectangle (105-cm long and 45-cm wide) | 0.41 | 1.22 | 0.82 | ◯ | Δ | Δ |
| Ex. 5 | Yes | No | No | Yes | 60° | Rectangle (105-cm long and 45-cm wide) | 0.31 | 1.32 | 0.81 | ◯ | Δ | Δ |
| Ex. 6 | Yes | No | No | Yes | 10° | Rectangle (105-cm long and 45-cm wide) | 0.33 | 1.11 | 0.85 | ◯ | Δ | Δ |
| Ex. 7 | Yes | No | 1 mm | No | — | Rectangle (105-cm long and 45-cm wide) | 0.18 | 1.31 | 0.31 | Δ | Δ | ◎◎◯ |
| Ex. 8 | Yes | No | 2 mm | No | — | Rectangle (105-cm long and 45-cm wide) | 0.20 | 1.25 | 0.32 | Δ | Δ | ◎◎◯ |
| Ex. 9 | Yes | No | 3 mm | No | — | Rectangle (105-cm long and 45-cm wide) | 0.20 | 1.21 | 0.25 | Δ | Δ | ◎◎◯ |
| Ex. 10 | Yes | No | 8 mm | No | — | Rectangle (105-cm long and 45-cm wide) | 0.21 | 1.26 | 0.39 | Δ | Δ | ◎◎◯ |
| Ex. 11 | Yes | No | 10 mm | No | — | Rectangle (105-cm long and 45-cm wide) | 0.27 | 1.28 | 0.55 | Δ | Δ | ◎◎ |
| Ex. 12 | Yes | No | 1 mm | Yes | 23° | Rectangle (105-cm long and 45-cm wide) | 0.38 | 1.35 | 0.33 | ◯ | Δ | ◎◎◯ |
| Ex. 13 | Yes | No | 2 mm | Yes | 23° | Rectangle (105-cm long and 45-cm wide) | 0.51 | 1.13 | 0.35 | ◎◎ | Δ | ◎◎◯ |
| Ex. 14 | Yes | No | 3 mm | Yes | 23° | Rectangle (105-cm long and 45-cm wide) | 0.55 | 1.22 | 0.31 | ◎ | Δ | ◎◎◯ |
| Ex. 15 | Yes | No | 4 mm | Yes | 23° | Rectangle (105-cm long and 45-cm wide) | 0.58 | 1.23 | 0.33 | ◎ | Δ | ◎◎◯ |
| Ex. 16 | Yes | No | 6 mm | Yes | 23° | Rectangle (105-cm long and 45-cm wide) | 0.59 | 1.14 | 0.38 | ◎ | Δ | ◎◎◯ |
| Ex. 17 | Yes | No | 8 mm | Yes | 23° | Rectangle (105-cm long and 45-cm wide) | 0.57 | 1.12 | 0.36 | ◎ | Δ | ◎◎◯ |
| Ex. 18 | Yes | No | 10 mm | Yes | 23° | Rectangle (105-cm long and 45-cm wide) | 0.43 | 1.48 | 0.56 | ◯ | Δ | ◎◎ |
| Ex. 19 | Yes | Yes | No | No | — | Rectangle (105-cm long and 45-cm wide) | 0.38 | 1.81 | 0.61 | ◯ | ◯ | ◯ |
| Ex. 20 | Yes | Yes | 4 mm | Yes | 23° | Rectangle (105-cm long and 45-cm wide) | 0.64 | 1.85 | 0.33 | ◎◯ | ◯ | ◎◎◯ |

First, it has been found that in Example 1 in which the waste liquid was heated, the recovery amount and the surfactant concentration in the recovered liquid are each higher than those of Comparative Example 1 in which the waste liquid was not heated and they are 0.15 L or more and 0.75% or more, respectively, showing preferable values.

Next, the recovery amount in Examples 2 to 6 which used an atomization chamber with a tapered structure is higher than that in Example 1 and is 0.3 L or more, showing a more preferable value. In particular, when the taper angle is 15° or more and 55° or less, the recovery amount is particularly preferable (0.35 L or more) (Examples 2 to 4). This occurs because the mist recovery efficiency is improved when the atomization chamber has a tapered structure. On the other hand, the development residue concentration in the recovered liquid is 1.0% or less and thus is preferable, but shows a slight increase over that of Example 1 not having a tapered structure. This has revealed a reduction in separation efficiency of the development residue.

Next, in Examples 7 to 11 which used the punching board 71E, the development residue concentration in the recovered liquid shows a significant reduction and is 0.6% or less, a preferable value. Particularly, when the hole has a diameter of 8 mm or less, the development residue concentration is 0.4% or less, the most preferable value (Examples 7 to 10).

Next, it has been found that In Examples 12 to 18 in which the atomization chamber 71 had the punching board 71E and the tapered structure, a high recovery amount and a low development residue concentration are achieved. More specifically, the development residue concentration shows a more preferable value and is 0.6% or more; the recovery amount is more preferable and 0.3 L or more. Particularly when the punching board 71E has a hole diameter of 2 mm or more and 8 mm or less, the recovery amount is considerably improved and shows a more preferable value, 0.45 L or more (Examples 13 to 17). Such an improvement occurs due to a synergistic effect between the punching board 71E for straightening of the flow of the mist-containing air and the atomization chamber 71 with a tapered structure for preventing the accumulation of the mist-containing air.

Next, in Examples 19 and 20 which had the air heating mechanism, a high recovery amount is achieved. Particularly in Example 20 in which the device further had the waste-liquid heating mechanism, the atomization chamber 71 with a taper, and the punching board 71E, the recovery amount is 0.6 L or more, showing a value in the most preferable range.

Examples 21 to 30

Next, Examples 21 to 30 corresponding to the second to fourth separation and recovery methods will be described.

With respect to water-based development waste liquids containing, in various concentrations, a development residue, a surfactant (Newcol NT-7 (cloud point: 33° C.), Newcol 2303-Y (38° C.), or Newcol 2308-LY (38° C.), each product of Nippon Nyukazai), an inorganic base (pH regulator: potassium carbonate), and water; and water-based development waste liquids containing, in addition to them, various concentrations of a layer separation accelerator (either one or both of diethylene glycol monohexyl ether and diethylene glycol dibutyl ether), data on the relation between the heating temperature and the presence or absence of layer separation were collected and 600 learning data in total were prepared.

The concentration of the layer separation accelerator in the water-based development waste liquid was quantitatively determined by gas chromatographic mass spectrometry. The respective concentrations of the development residue and the surfactant in the water-based development waste liquid were determined as follows. First, a nonvolatile content is found by weighing the development waste liquid before and after it is dried and hardened and thus, respective mass percent concentrations of the surfactant and the development reside are determined. More specifically, after a predetermined amount of the development waste liquid is collected and filtered through a membrane filter having a pore size of 0.8 μm to remove the development residue, weight W1 is measured. Next, after the development waste liquid is dried and hardened in a thermostatic chamber of 40° C., weight W2 of the nonvolatile component is measured. The concentration of the surfactant is determined by subtracting the concentration of the layer separation accelerator determined by the aforesaid gas chromatographic mass spectroscopy from the value calculated from $(W2/W1)\times100$. Similarly, after a predetermined amount of the development waste liquid is collected again, weight W3 is measured without filtering through the membrane filter. After the development waste liquid is dried and hardened in a thermostatic tank of 40° C., weight W4 of the nonvolatile component is measured. The value obtained by subtracting the aforesaid surfactant concentration from the nonvolatile component concentration as calculated from $(W4/W3)\times100$ is the concentration of the development waste liquid.

<Water-Based Development Waste Liquid not Containing Layer Separation Accelerator>

From the data thus collected, logistic regression analysis was performed with the concentration (mass %) of the development residue in the water-based development waste liquid, the concentration (mass %) of the surfactant in the water-based development waste liquid, the pH of the water-based development waste liquid, the concentration (mass %) of the layer separation accelerator in the water-based development waste liquid, and the temperature (° C.) of the water-based development waste liquid as an explanatory variable and with the presence or absence of layer separation in the water-based development waste liquid as a criterion valuable. In the formula thus obtained, when the concentration Cb of the layer separation accelerator was set 0, the following formulas (4) and (5) described in the third method were obtained.

Layer separation is thought to occur at a temperature satisfying the formulas (4) and (5). Such a temperature corresponds to the "predicted temperature" in the third method and also corresponds to the "layer-separation temperature" in the second method. Since in the details of the formulas (4) and (5), the respective regression coefficients of the concentration (W) of the development residue and the concentration (Ca) of the surfactant are minus, their increase makes it difficult to cause layer separation. In addition, since the respective regression coefficients of the pH and the temperature (T) of the water-based development waste liquid are plus, their increase makes it easy to cause layer separation.

<Water-Based Development Waste Liquid Containing Layer Separation Accelerator>

From the data thus collected, logistic regression analysis was performed with the concentration (mass %) of the development residue in the water-based development waste liquid, the concentration (mass %) of the surfactant in the water-based development waste liquid, the pH of the water-based development waste liquid, the concentration (mass %) of the layer separation accelerator in the water-based development waste liquid, and the temperature (° C.) of the water-based development waste liquid as an explanatory variable and with the presence or absence of layer separation in the water-based development waste liquid as a criterion valuable. As a result, the formulas (6) and (7) described in the fourth method were obtained.

Layer separation is thought to occur at a temperature satisfying the formulas (6) and (7). Such a temperature corresponds to the "predicted temperature" in the fourth method and also corresponds to the "layer-separation temperature" in the second method. Since in the details of the formulas (6) and (7), the respective regression coefficients of the concentration (W) of the development residue and the concentration (Ca) of the surfactant are minus, their increase makes it difficult to cause layer separation. In addition, since the respective regression coefficients of the pH and the temperature (T) of the water-based development waste liquid and the concentration (Cb) of the layer separation accelerator are plus, their increase make it easy to cause layer separation.

<Recovery of Water-Based Developer>

Water-based development waste liquids having the composition as shown in Table 2 were prepared and the presence or absence of layer separation and recovery efficiency of a water-based developer when the waste liquids were heated respectively at specified temperatures were confirmed. The results are shown in Table 2. The separation and recovery of the development waste liquids was performed as in Example 20 by using the separation and recovery device 7 shown in FIG. 2. The respective concentrations of the components of the waste liquid were measured by the analysis method described above.

As shown in Table 2, layer separation of the water-based development waste liquid occurred and therefore, a water-based developer was recovered efficiently. Described specifically, in Examples 21 to 24 in which heating was conducted at a predicted temperature (layer-separation temperature) satisfying the formulas (4) and (5) and in Examples 25 to 30 in which heating was conducted at a predicted temperature (layer-separation temperature) satisfying the formulas (6) and (7), layer separation occurred (○ in Table 2) and as a result, a processing rate (recovery rate of the developer layer) exceeded 15 L/hour (◎ in Table 2). On the other hand, in Comparative Examples 2 to 5 in which heating was not conducted at a predicted temperature (layer-separation temperature) satisfying the formulas (4) and (5) and in Comparative Examples 6 to 11 in which heating was not conducted at a predicted temperature (layer-separation temperature) satisfying the formulas (6) and (7), no layer separation occurred (x in Table 2) and as a result, the processing rate was 3.6 to 12.8 L/hour (Δ in Table 2).

TABLE 2

| | | Ex. 21 | Ex. 22 | Ex. 23 | Ex. 24 | Comp. Ex. 2 | Comp. Ex. 3 | Comp. Ex. 4 | Comp. Ex. 5 | Ex. 25 | Ex. 26 | Ex 27 |
|---|---|---|---|---|---|---|---|---|---|---|---|---|
| Development residue concentration [wt %] | | 0.7 | 1.0 | 2.9 | 0.3 | 0.7 | 5.6 | 2.9 | 0.3 | 0.7 | 0.3 | 4.3 |
| Surfactant | Newcol NT-7 [wt %] | 1.2 | 1.1 | | | 1.2 | 3.7 | | | 1.2 | 0.9 | 1.3 |
| | Newcol 2303-Y [wt %] | | | 1.9 | | | | 1.9 | | | | |
| | Newcol 2308-LY [wt %] | | | | 1.2 | | | | 1.2 | | | |
| Layer-separation accelerator | Diethylene glycol monohexyl ether [wt %] | | | | | | | | | 0.98 | 0.40 | 0.62 |
| | Diethylene glycol dibutyl ether [wt %] | | | | | | | | | 0.11 | 0.12 | 0.16 |
| pH of water-based development waste liquid | | 10.6 | 10.6 | 10.3 | 10.2 | 10.6 | 10 | 10.3 | 10.2 | 10.6 | 9.8 | 10.3 |
| Waste liquid temperature [° C.] | | 52 | 52 | 52 | 52 | 40 | 52 | 40 | 40 | 47 | 43 | 46 |
| Layer separation (○: separated, X: not separated) | | ○ | ○ | ○ | ○ | X | X | X | X | ○ | ○ | ○ |
| Processing rate | | ◎ | ◎ | ◎ | ◎ | Δ | Δ | Δ | Δ | ◎ | ◎ | ◎ |

| | | Ex. 28 | Ex. 29 | Ex. 30 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|
| Development residue concentration [wt %] | | 0.5 | 2.6 | 3.1 | 2.0 | 4.3 | 0.4 | 2.6 | 0.3 | 0.6 |
| Surfactant | Newcol NT-7 [wt %] | | | 0.6 | 3.2 | 3.4 | | | 0.9 | 3.3 |
| | Newcol 2303-Y [wt %] | 2.0 | | | | | 4.9 | | | |
| | Newcol 2308-LY [wt %] | | 3.3 | | | | | 3.3 | | |
| Layer-separation accelerator | Diethylene glycol monohexyl ether [wt %] | 0.41 | 0.47 | 0.35 | 0.29 | 0.46 | 0.57 | 0.47 | 0.40 | 0.64 |
| | Diethylene glycol dibutyl ether [wt %] | 0.22 | 0.19 | | 0.34 | 0.18 | 0.16 | 0.19 | 0.12 | |
| pH of water-based development waste liquid | | 10 | 9.9 | 10.3 | 10.1 | 10.2 | 9.7 | 9.9 | 9.8 | 10.2 |
| Waste liquid temperature [° C.] | | 49 | 52 | 52 | 43 | 46 | 40 | 43 | 40 | 40 |
| Layer separation (○: separated, X: not separated) | | ○ | ○ | ○ | X | X | X | X | X | X |
| Processing rate | | ◎ | ◎ | ◎ | Δ | Δ | Δ | Δ | Δ | Δ |

REFERENCE SIGNS LIST

1: Development device
2: Carrier unit
7: Separation and recovery device
11: Development region
12: Rinse region
31: Discharge pipe (developer supply unit)
32: Discharge pipe (rinse liquid supply unit)
41: Roll brush (unexposed-portion removal unit)
71: Atomization chamber
71A: Reservoir space
71Aa: Bottom wall
71Ab: Side wall
71B: Ultrasonic element
71C: Mist recovery port
71D: Inclined wall
71E: Punching card (mist sorting mechanism)
71F: Upper space
71G: Lower space
71H: Separation plate
71I: Pressure metal fitting
71J: Packing
71K: Separation film
72: Mist recovery mechanism
73: Condensation mechanism

74: Storage chamber
75: Pipe
P: Original plate
S: Development system

What is claimed is:

1. A separation and recovery method for separating and recovering a solvent from a development waste liquid generated during development of a flexographic-printing original plate, comprising:
heating the development waste liquid to 35° C. or more and 90° C. or less,
atomizing the development waste liquid heated in the heating into mists, and
recovering the mists formed by the atomizing.

2. The separation and recovery method according to claim 1, wherein the development waste liquid is a water-based development waste liquid generated by carrying out development using a water-based developer containing at least a surfactant.

3. The separation and recovery method according to claim 1, further comprising:
sorting the mists formed by the atomizing into a mist to be recovered and a mist to be recondensed and returned in the development waste liquid according to a size and/or mass of the mists, wherein:
a solvent is recovered by separating at least a portion of the development residue from the development waste liquid by the mist sorting.

4. The separation and recovery method according to claim 1, further comprising:
returning an overflowing portion of the development waste liquid, which development waste liquid has remained after sent to an atomization chamber from a storage chamber for storing a development waste liquid supplied from the outside and subjected to atomization processing, to the storage chamber and sending the portion to the atomization chamber again.

5. The separation and recovery method according to claim 1, wherein:
the atomization chamber to be used in the atomizing has an upper space for storing the development waste liquid therein and a lower space having an ultrasonic element placed therein, and
in the atomizing, a temperature of a fluid flowing in the lower space is set to 10° C. or more and 40° C. or less and a temperature difference between the upper space and the lower space is set to 5° C. or more and 70° C. or less.

6. A developer recycling method, comprising:
supplying a solvent recovered by the separation and recovery method as claimed in claim 1 to a development device having a carrier unit for carrying a flexographic-printing original plate having an exposed portion and an unexposed portion formed in a photosensitive resin layer, a developer supply unit for supplying a developer to the original plate carried by the carrier unit and placed in a development region, an unexposed-portion removal unit for scrubbing the surface of the original plate placed in the development region to remove the unexposed portion, and a rinse liquid supply unit for supplying a rinse liquid to the original plate carried by the carrier unit and placed in a rinse region adjacent to the development region and thereby washing the surface of the original plate;
and reusing the solvent as a portion of the developer to be supplied from the developer supply unit and/or a portion of the rinse liquid to be supplied from the rinse liquid supply unit.

7. A method of producing a water-based developer, wherein:
a new developer and/or rinse liquid is produced using the solvent recovered by the separation and recovery method as claimed in claim 1.

8. A method of producing a printing plate, comprising:
irradiating a printing original plate with infrared rays to form a pattern,
irradiating the printing original plate having the pattern formed thereon with ultraviolet rays to expose the pattern, and
removing the unexposed portion in the exposing step with the water-based developer as claimed in claim 7.

9. A separation and recovery method for separating and recovering a solvent from a water-based development waste liquid generated by carrying out development of a flexographic-printing original plate with a water-based developer containing at least a surfactant, comprising:
heating the water-based development waste liquid at a temperature which causes separation of the water-based development waste liquid in a static state into two layers,
atomizing the development waste liquid heated in the heating into mists, and
recovering the mists formed by the atomizing.

10. The separation and recovery method according to claim 9, further comprising prior to the heating:
obtaining an adjusted waste liquid by carrying out at least one adjustment selected from the group consisting of the following (A) to (D):
(A) increasing a pH of the water-based development waste liquid;
(B) adding, to the water-based development waste liquid, a compound represented by the following formula (1), a compound represented by the following formula (2), or a combination of them:
Formula (1): $R^1O(A^1O)_nR^2$ (wherein, $R^1$ and $R^2$ each independently represent an alkyl group having 2 to 6 carbon atoms or an alkenyl group having 2 to 6 carbon atoms, $A^1$ represents an alkylene group having 2 to 4 carbon atoms, and n is an integer of 1 to 5)
Formula (2): $R^3O(A^2O)_mH$ (wherein, $R^3$ represents an alkyl group having 3 to 8 carbon atoms or an alkenyl group having 3 to 8 carbon atoms, $A^2$ represents an alkylene group having 2 to 4 carbon atoms, and m is an integer of 1 to 5)
(C) removing a portion of a development residue from the water-based development waste liquid; and
(D) removing a portion of the surfactant from the water-based development waste liquid.

11. The separation and recovery method according to claim 9, wherein the surfactant is represented by the following formula (3):
Formula (3): $RO(AO)_pH$ (wherein, R represents an alkyl group or aryl group having 10 to 20 carbon atoms, A represents an alkylene group having 2 to 4 carbon atoms, and p is an integer of 1 to 50).

12. The separation and recovery method according to claim 11, wherein
R represents an alkyl group or aryl group having 10 to 18 carbon atoms,
A represents an alkylene group having 2 to 4 carbon atoms, and
p is an integer of 6 to 10.

13. The separation and recovery method according to claim 9, wherein the surfactant has a cloud point of 40° C. or less.

14. The separation and recovery method according to claim 9, wherein the water-based development waste liquid contains an inorganic base.

15. The separation and recovery method according to claim 9, wherein the water-based development waste liquid causes layer separation at 90° C. or less in a static state.

16. A separation and recovery method for separating and recovering a solvent from a water-based development waste liquid generated by carrying out development of a flexographic-printing original plate, comprising:

heating the water-based development waste liquid at a temperature predicted to separate the water-based development waste liquid in a static state into two layers, atomizing the development waste liquid heated in the heating into mists, and recovering the mists formed in the atomizing, wherein:

the water-based development waste liquid contains a surfactant having a cloud point of 40° C. or less, a development residue, and water, and the predicted temperature is a temperature predicted based on a concentration of the development residue in the water-based development waste liquid, a concentration of the surfactant in the water-based development waste liquid, and a pH of the water-based development waste liquid.

17. The separation and recovery method according to claim 16, wherein the predicted temperature satisfies the following formulas (4) and (5):

[Math. 1]

$$\frac{1}{1+\exp(-z)} \geq 0.5 \quad \text{Formula (4)}$$

[Math. 2]

$$z = -0.60713385 \times \frac{W - 2.03591046}{1.56737401407577} - 1.27547875 \times \frac{Ca - 2.45178061}{1.26267792013641} + 0.93568397 \times \frac{\text{pH} - 10.09333333}{0.301256627} + 3.17537577 \times \frac{T - 51.25}{7.96476616} + 3.30903047 \quad \text{Formula (5)}$$

(wherein, W is a concentration (mass %) of the development residue in the water-based development waste liquid, Ca is a concentration (mass %) of the surfactant in the water-based development waste liquid, pH is a pH of the water-based development waste liquid, and T is a temperature (° C.) of the water-based development waste liquid).

18. The separation and recovery method according to claim 16, wherein the predicted temperature is 90° C. or less.

19. A separation and recovery method for separating and recovering a solvent from a water-based development waste liquid generated by developing a flexographic-printing original plate, comprising:

heating the water-based development waste liquid at a temperature predicted to cause separation of the water-based development waste liquid in a static state into two layers, atomizing the development waste liquid heated in the heating into mists, and recovering the mists formed by the atomizing, wherein:

the water-based development waste liquid contains a surfactant having a cloud point of 40° C. or less, a development residue, water, and a compound represented by the following formula (1) and/or a compound represented by the following formula (2):

Formula (1): $R^1O(A^1O)_nR^2$ (wherein, $R^1$ and $R^2$ each independently represent an alkyl group having 2 to 6 carbon atoms or an alkenyl group having 2 to 6 carbon atoms, $A^1$ represents an alkylene group having 2 to 4 carbon atoms, and n is an integer of 1 to 5)

Formula (2): $R^3O(A^2O)_mH$ (wherein, $R^3$ represents an alkyl group having 3 to 8 carbon atoms or an alkenyl group having 3 to 8 carbon atoms, $A^2$ represents an alkylene group having 2 to 4 carbon atoms, and m is an integer of 1 to 5), and the predicted temperature is a temperature predicted based on a concentration of the development residue in the water-based development waste liquid, a concentration of the surfactant in the water-based development waste liquid, a pH of the water-based development waste liquid, and a total concentration of the compounds represented by the formulas (1) and (2) in the water-based development waste liquid.

20. The separation and recovery method according to claim 19, wherein the predicted temperature satisfies the following formulas (6) and (7):

[Math. 3]

$$\frac{1}{1+\exp(-z)} \geq 0.5 \quad \text{Formula (6)}$$

[Math. 4]

$$z = -0.60713385 \times \frac{W - 2.03591046}{1.56737401407577} - 1.27547875 \times \frac{Ca - 2.45178061}{1.26267792013641} + 0.93568397 \times \frac{\text{pH} - 10.09333333}{0.301256627} + 1.45202002 \times \frac{Cb - 0.71332546}{0.303775970083218} + 3.17537577 \times \frac{T - 51.25}{7.96476616} + 3.30903047 \quad \text{Formula (7)}$$

(wherein, W is a concentration (mass %) of the development residue in the water-based development waste liquid, Ca is a concentration (mass %) of the surfactant in the water-based development waste liquid, pH is a pH of the water-based development waste liquid, Cb is a total concentration (mass %) of the compounds represented by the formulas (1) and (2) in the water-based development waste liquid, and T is the temperature (C) of the water-based development waste liquid).

21. A separation and recovery method for separating and recovering a solvent from a water-based development waste liquid generated by developing a flexographic-printing original plate, comprising:

determining a heating temperature of the development waste liquid, heating the development waste liquid at the temperature determined in the heating-temperature determining, atomizing the development waste liquid heated in the heating into mists, and recovering the mists formed by the atomizing, wherein:

the development waste liquid can be separated into two layers different in dispersion concentration of a development residue by heating, and a temperature to be determined in the heating-temperature determining is calculated from a temperature at which the development waste liquid is separated and satisfies the following formulas (4) and (5):

[Math. 5]

$$\frac{1}{1+\exp(-z)} \geq 0.5 \qquad \text{Formula (4)}$$

[Math. 6]

$$z = -0.60713385 \times \frac{W - 2.03591046}{1.56737401407577} - 1.27547875 \times \frac{Ca - 2.45178061}{1.26267792013641} + 0.93568397 \times \frac{\mathrm{pH} - 10.09333333}{0.301256627} + 3.17537577 \times \frac{T - 51.25}{7.96476616} + 3.30903047 \qquad \text{Formula (5)}$$

(wherein, W is a concentration (mass %) of the development residue in the water-based development waste liquid, Ca is a concentration (mass %) of the surfactant in the water-based development waste liquid, pH is a pH of the water-based development waste liquid, and T is a temperature (° C.) of the water-based development waste liquid).

22. A separation and recovery device for separating and recovering a solvent component from a development waste liquid generated during development of a flexographic-printing original plate, comprising:

a waste-liquid heater for heating the development waste liquid, an atomization chamber having an ultrasonic element for atomizing the development waste liquid heated in the waste-liquid heater into mists, and a mist recovery mechanism for recovering the mists formed in the atomization chamber.

23. The separation and recovery device according to claim 22, wherein:

the atomization chamber has a reservoir space for storing the development waste liquid, the ultrasonic element provided in the reservoir space, and a mist recovery port provided vertically above the reservoir space for supplying the mists formed in the reservoir space to the mist recovery mechanism;

the reservoir space is a substantially tube-shaped space surrounded by a bottom wall and side walls connected to the periphery of the bottom wall;

the side walls have, at the upper end thereof, an inclined wall connected thereto and inclining to a planar-view center of the reservoir space as moving vertically upward; and the mist recovery port is contoured by the upper end of the inclined wall.

24. The separation and recovery device according to claim 22, further comprising:

a mist sorting mechanism for sorting the mists formed in the atomization chamber into a mist to be recovered by the mist recovery mechanism and a mist to be recondensed and returned into the development waste liquid according to a size and/or a mass of the mists.

25. The separation and recovery device according to claim 24, wherein:

the mist sorting mechanism has at least one layer of a punching board provided between a liquid surface of the development waste liquid and the mist recovery port in the atomization chamber.

26. The separation and recovery device according to claim 25, wherein the punching board has a hole with a diameter of 2 mm or more and 8 mm or less.

27. The separation and recovery device according to claim 22, further comprising:

an air heater for heating air to be supplied into the atomization chamber.

28. The separation and recovery device according to claim 22, further comprising:

a condensation mechanism for condensing the mists recovered by the mist recovery mechanism.

29. The separation and recovery device according to claim 22, comprising:

a storage chamber for storing the development waste liquid supplied from the outside, a pump and a pipe for supplying the development waste liquid from the storage chamber to the atomization chamber, and a pipe for feeding an overflowing portion of the development waste liquid which has been supplied to the atomization chamber and has remained after atomization processing to the storage chamber again.

30. The separation and recovery device according to claim 22, wherein the development waste liquid contains a photosensitive resin having at least a polymer, a monomer, and an initiator.

31. The separation and recovery device according to claim 22, wherein the development waste liquid is a water-based development waste liquid generated by carrying out development using a water-based developer containing at least a surfactant.

32. The separation and recovery device according to claim 31, wherein the waste-liquid heater heats the water-based development waste liquid at a temperature that causes separation of the water-based development waste liquid in a static state into two layers.

33. A development system for developing a flexographic-printing original plate having a photosensitive resin layer on a surface thereof, comprising:

a development device having a carrier unit for carrying the original plate having an exposed portion and an unexposed portion formed in the photosensitive resin layer, a developer supply unit for supplying a developer to the original plate carried by the carrier unit and placed in a development region, an unexposed-portion removal unit for scrubbing the surface of the original plate placed in the development region to remove the unexposed portion, and a rinse liquid supply unit for supplying a rinse liquid to the original plate carried by the carrier unit and placed in a rinse region adjacent to the development region and thereby washing the surface of the original plate, and the separation and recovery device as claimed in claim 22, wherein:

the solvent recovered by the separation and recovery device is reused as a portion of the developer to be supplied from the developer supply unit and/or a portion of the rinse liquid to be supplied from the rinse liquid supply unit.

34. The development system according to claim 33 for producing a flexographic printing plate by developing the original plate.

* * * * *